(12) United States Patent
Morris et al.

(10) Patent No.: US 9,599,279 B2
(45) Date of Patent: Mar. 21, 2017

(54) ELASTICALLY DEFORMABLE MODULE INSTALLATION ASSEMBLY

(71) Applicant: GM GLOBAL TECHNOLOGY OPERATIONS LLC, Detroit, MI (US)

(72) Inventors: Steven E. Morris, Fair Haven, MI (US); Jennifer P. Lawall, Waterford, MI (US); Paul B. Stambaugh, Dearborn, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 548 days.

(21) Appl. No.: 14/134,844

(22) Filed: Dec. 19, 2013

(65) Prior Publication Data

US 2015/0176759 A1    Jun. 25, 2015

(51) Int. Cl.
*F16B 5/06* (2006.01)
*B60R 13/02* (2006.01)
(Continued)

(52) U.S. Cl.
CPC ......... *F16M 13/02* (2013.01); *B60R 13/0206* (2013.01); *B62D 27/04* (2013.01);
(Continued)

(58) Field of Classification Search
CPC ...... F16B 5/065; F16B 5/0657; F16B 5/0664; B60R 13/0206; B62D 27/04; B62D 27/06;
(Continued)

(56) References Cited

U.S. PATENT DOCUMENTS

| 419,358 A | 1/1890 | Raymond et al. |
|---|---|---|
| 1,219,398 A | 3/1917 | Huntsman |

(Continued)

FOREIGN PATENT DOCUMENTS

| BE | 842302 A | 9/1976 |
|---|---|---|
| CN | 1036250 A | 10/1989 |

(Continued)

OTHER PUBLICATIONS

U.S. Appl. No. 13/939,503, filed Jul. 11, 2013, entitled "Elastically Averaged Alignment Systems and Methods," inventor: Joel Colombo.

(Continued)

*Primary Examiner* — Ryan Kwiecinski
(74) *Attorney, Agent, or Firm* — Cantor Colburn LLP (57) ABSTRACT

Module installation assembly including a base structure having a base portion, a first and second bracket, the base portion disposed in a base plane, the first bracket extending perpendicularly from the base portion, the second bracket extending perpendicularly from the base portion, wherein the first bracket is a T-shaped member having a main portion, a pair of wing portions and a pair of recesses defined by the pair of wing portions and a segment of the main portion. Also included is a module to be mated with the base structure, the module including a first module end and a second module end, wherein the first module end includes a first pair of protrusions formed of an elastically deformable material and configured to be rotated into an interference condition with the first bracket.

19 Claims, 5 Drawing Sheets

(51) Int. Cl.
  *B62D 27/04* (2006.01)
  *H05K 5/00* (2006.01)
  *F16M 13/02* (2006.01)
  *B62D 27/06* (2006.01)
  *F16M 11/04* (2006.01)
  *H05K 5/02* (2006.01)

(52) U.S. Cl.
  CPC ............ *B62D 27/06* (2013.01); *F16B 5/0657* (2013.01); *F16B 5/0664* (2013.01); *F16M 11/041* (2013.01); *H05K 5/0073* (2013.01); *H05K 5/0204* (2013.01)

(58) Field of Classification Search
  CPC ............ Y10T 403/1624; H05K 5/0073; H05K 5/0204; H05K 5/0221
  USPC ............ 403/13, 14, DIG. 14, 282; 248/345, 248/346.04
  See application file for complete search history.

(56) References Cited

U.S. PATENT DOCUMENTS

| | | |
|---|---|---|
| 1,261,036 A | 4/1918 | Kerns |
| 1,301,302 A | 4/1919 | Nolan |
| 1,556,233 A | 10/1925 | Maise |
| 1,819,126 A | 8/1931 | Scheibe |
| 1,929,848 A | 10/1933 | Neely |
| 1,968,168 A | 7/1934 | Place |
| 1,982,076 A | 11/1934 | Spahn |
| 1,999,990 A | 4/1935 | Carr |
| 2,006,525 A | 7/1935 | Thal |
| 2,267,558 A | 12/1941 | Birger et al. |
| 2,275,103 A | 3/1942 | Gooch et al. |
| 2,275,900 A | 3/1942 | Hall |
| 2,385,180 A | 9/1945 | Allen |
| 2,482,488 A | 9/1949 | Franc |
| 2,560,530 A | 7/1951 | Burdick |
| 2,612,139 A | 9/1952 | Collins |
| 2,688,894 A | 9/1954 | Modrey |
| 2,693,014 A | 11/1954 | Monahan |
| 2,707,607 A | 5/1955 | O'Connor |
| 2,778,399 A | 1/1957 | Mroz |
| 2,780,128 A | 2/1957 | Rapata |
| 2,788,046 A | 4/1957 | Joseph |
| 2,862,040 A | 11/1958 | Curran |
| 2,902,902 A | 9/1959 | Slone |
| 2,940,149 A | 6/1960 | O'Connor |
| 2,946,612 A | 7/1960 | Ahlgren |
| 2,958,230 A | 11/1960 | Haroldson |
| 3,005,282 A | 10/1961 | Christiansen |
| 3,014,563 A | 12/1961 | Bratton |
| 3,087,352 A | 4/1963 | Daniel |
| 3,089,269 A | 5/1963 | McKiernan |
| 3,130,512 A | 4/1964 | Van Buren, Jr. |
| 3,152,376 A | 10/1964 | Boser |
| 3,168,961 A | 2/1965 | Yates |
| 3,169,004 A | 2/1965 | Rapata |
| 3,169,439 A | 2/1965 | Rapata |
| 3,188,731 A | 6/1965 | Sweeney |
| 3,194,292 A | 7/1965 | Borowsky |
| 3,213,189 A | 10/1965 | Mitchell et al. |
| 3,230,592 A | 1/1966 | Hosea |
| 3,233,358 A | 2/1966 | Dehm |
| 3,233,503 A | 2/1966 | Birger |
| 3,244,057 A | 4/1966 | Mathison |
| 3,248,995 A | 5/1966 | Meyer |
| 3,291,495 A | 12/1966 | Liebig |
| 3,310,929 A | 3/1967 | Garvey |
| 3,413,752 A | 12/1968 | Perry |
| 3,473,283 A | 10/1969 | Meyer |
| 3,531,850 A | 10/1970 | Durand |
| 3,551,963 A | 1/1971 | Long |
| 3,643,968 A | 2/1972 | Horvath |
| 3,669,484 A | 6/1972 | Bernitz |
| 3,680,272 A | 8/1972 | Meyer |
| 3,733,655 A | 5/1973 | Kolibar |
| 3,800,369 A | 4/1974 | Nikolits |
| 3,841,044 A | 10/1974 | Brown |
| 3,841,682 A | 10/1974 | Church |
| 3,842,565 A | 10/1974 | Brown et al. |
| 3,845,961 A | 11/1974 | Byrd, III |
| 3,847,492 A | 11/1974 | Kennicutt et al. |
| 3,860,209 A | 1/1975 | Strecker |
| 3,868,804 A | 3/1975 | Tantlinger |
| 3,895,408 A | 7/1975 | Leingang |
| 3,897,967 A | 8/1975 | Barenyi |
| 3,905,570 A | 9/1975 | Nieuwveld |
| 3,972,550 A | 8/1976 | Boughton |
| 3,988,808 A | 11/1976 | Poe et al. |
| 4,035,874 A | 7/1977 | Liljendahl |
| 4,039,215 A | 8/1977 | Minhinnick |
| 4,042,307 A | 8/1977 | Jarvis |
| 4,043,585 A | 8/1977 | Yamanaka |
| 4,158,511 A | 6/1979 | Herbenar |
| 4,169,297 A | 10/1979 | Weihrauch |
| 4,193,588 A | 3/1980 | Doneaux |
| 4,213,675 A | 7/1980 | Pilhall |
| 4,237,573 A | 12/1980 | Weihrauch |
| 4,267,680 A | 5/1981 | Delattre |
| 4,300,851 A | 11/1981 | Thelander |
| 4,313,609 A | 2/1982 | Clements |
| 4,314,417 A | 2/1982 | Cain |
| 4,318,208 A | 3/1982 | Borja |
| 4,325,574 A | 4/1982 | Umemoto et al. |
| 4,358,166 A | 11/1982 | Antoine |
| 4,363,839 A | 12/1982 | Watanabe et al. |
| 4,364,150 A | 12/1982 | Remington |
| 4,384,803 A | 5/1983 | Cachia |
| 4,394,853 A | 7/1983 | Lopez-Crevillen et al. |
| 4,406,033 A | 9/1983 | Chisholm et al. |
| 4,407,413 A | 10/1983 | Jansson |
| 4,477,142 A | 10/1984 | Cooper |
| 4,481,160 A | 11/1984 | Bree |
| 4,527,760 A | 7/1985 | Salacuse |
| 4,564,232 A | 1/1986 | Fujimori et al. |
| 4,575,060 A | 3/1986 | Kitagawa |
| 4,591,203 A | 5/1986 | Furman |
| 4,599,768 A | 7/1986 | Doyle |
| 4,605,575 A | 8/1986 | Auld et al. |
| 4,616,951 A | 10/1986 | Maatela |
| 4,648,649 A | 3/1987 | Beal |
| 4,654,760 A | 3/1987 | Matheson et al. |
| 4,672,732 A | 6/1987 | Ramspacher |
| 4,745,656 A | 5/1988 | Revlett |
| 4,757,655 A | 7/1988 | Nentoft |
| 4,767,647 A | 8/1988 | Bree |
| 4,805,272 A | 2/1989 | Yamaguchi |
| 4,807,335 A | 2/1989 | Candea |
| 4,817,999 A | 4/1989 | Drew |
| 4,819,983 A | 4/1989 | Alexander et al. |
| 4,843,975 A | 7/1989 | Welsch |
| 4,843,976 A | 7/1989 | Pigott et al. |
| 4,865,502 A | 9/1989 | Maresch |
| 4,881,764 A | 11/1989 | Takahashi et al. |
| 4,917,426 A | 4/1990 | Copp |
| 4,973,212 A | 11/1990 | Jacobs |
| 4,977,648 A | 12/1990 | Eckerud |
| 5,005,265 A | 4/1991 | Muller |
| 5,007,759 A * | 4/1991 | Scherer .................. B25H 3/006 403/13 |
| 5,039,267 A | 8/1991 | Wollar |
| 5,100,015 A | 3/1992 | Vanderstuyf |
| 5,111,557 A | 5/1992 | Baum |
| 5,139,285 A | 8/1992 | Lasinski |
| 5,154,479 A | 10/1992 | Sautter, Jr. |
| 5,165,749 A | 11/1992 | Sheppard |
| 5,170,985 A | 12/1992 | Killworth et al. |
| 5,180,219 A | 1/1993 | Geddie |
| 5,208,507 A | 5/1993 | Jung |
| 5,212,853 A | 5/1993 | Kaneko |
| 5,234,122 A | 8/1993 | Cherng |
| 5,250,001 A | 10/1993 | Hansen |
| 5,297,322 A | 3/1994 | Kraus |

(56) References Cited

U.S. PATENT DOCUMENTS

| | | |
|---|---|---|
| 5,309,663 A | 5/1994 | Shirley |
| 5,333,965 A | 8/1994 | Mailey |
| 5,339,491 A | 8/1994 | Sims |
| 5,342,139 A | 8/1994 | Hoffman |
| 5,348,356 A | 9/1994 | Moulton |
| 5,368,427 A | 11/1994 | Pfaffinger |
| 5,368,797 A | 11/1994 | Quentin et al. |
| 5,397,206 A | 3/1995 | Sihon |
| 5,407,310 A | 4/1995 | Kassouni |
| 5,446,965 A | 9/1995 | Makridis |
| 5,507,610 A | 4/1996 | Benedetti et al. |
| 5,513,603 A | 5/1996 | Ang et al. |
| 5,524,786 A | 6/1996 | Skudlarek |
| 5,538,079 A | 7/1996 | Pawlick |
| 5,556,808 A | 9/1996 | Williams et al. |
| 5,566,840 A | 10/1996 | Waldner |
| 5,575,601 A | 11/1996 | Skufca |
| 5,577,301 A | 11/1996 | Demaagd |
| 5,577,779 A | 11/1996 | Dangel |
| 5,580,204 A | 12/1996 | Hultman |
| 5,593,265 A | 1/1997 | Kizer |
| 5,601,453 A | 2/1997 | Horchler |
| 5,629,823 A | 5/1997 | Mizuta |
| 5,634,757 A | 6/1997 | Schanz |
| 5,639,140 A | 6/1997 | Labrash |
| 5,657,516 A | 8/1997 | Berg et al. |
| 5,666,749 A | 9/1997 | Waters |
| 5,667,271 A | 9/1997 | Booth |
| 5,670,013 A | 9/1997 | Huang et al. |
| 5,671,513 A * | 9/1997 | Kawahara ............ F16B 21/075 24/581.11 |
| 5,698,276 A | 12/1997 | Mirabitur |
| 5,702,779 A | 12/1997 | Siebelink, Jr. et al. |
| 5,706,559 A | 1/1998 | Oliver |
| 5,736,221 A | 4/1998 | Hardigg et al. |
| 5,765,942 A | 6/1998 | Shirai et al. |
| 5,775,860 A | 7/1998 | Meyer |
| 5,795,118 A | 8/1998 | Osada et al. |
| 5,797,170 A | 8/1998 | Akeno |
| 5,797,714 A | 8/1998 | Oddenino |
| 5,803,646 A | 9/1998 | Weihrauch |
| 5,806,915 A | 9/1998 | Takabatake |
| 5,810,535 A | 9/1998 | Fleckenstein et al. |
| 5,820,292 A | 10/1998 | Fremstad |
| 5,846,631 A | 12/1998 | Nowosiadly |
| 5,915,678 A | 6/1999 | Slocum et al. |
| 5,920,200 A | 7/1999 | Pendse |
| 5,929,382 A | 7/1999 | Moore |
| 5,931,514 A | 8/1999 | Chung |
| 5,934,729 A | 8/1999 | Baack |
| 5,941,673 A | 8/1999 | Hayakawa et al. |
| 5,988,678 A | 11/1999 | Nakamura |
| 6,006,941 A | 12/1999 | Hitchings |
| 6,010,306 A | 1/2000 | Bucher |
| 6,062,763 A | 5/2000 | Sirois et al. |
| 6,073,315 A | 6/2000 | Rasmussen |
| 6,079,083 A | 6/2000 | Akashi |
| 6,095,594 A | 8/2000 | Riddle et al. |
| 6,103,987 A | 8/2000 | Nordquist |
| 6,109,882 A | 8/2000 | Popov |
| 6,152,436 A | 11/2000 | Sonderegger et al. |
| 6,164,603 A | 12/2000 | Kawai |
| 6,193,430 B1 | 2/2001 | Culpepper et al. |
| 6,199,248 B1 | 3/2001 | Akashi |
| 6,202,962 B1 | 3/2001 | Snyder |
| 6,209,175 B1 | 4/2001 | Gershenson |
| 6,209,178 B1 | 4/2001 | Wiese et al. |
| 6,254,304 B1 | 7/2001 | Takizawa et al. |
| 6,264,869 B1 | 7/2001 | Notarpietro et al. |
| 6,283,540 B1 | 9/2001 | Siebelink, Jr. et al. |
| 6,286,214 B1 | 9/2001 | Bean |
| 6,289,560 B1 | 9/2001 | Guyot |
| 6,299,478 B1 | 10/2001 | Jones et al. |
| 6,311,960 B1 | 11/2001 | Pierman et al. |
| 6,318,585 B1 | 11/2001 | Asagiri |
| 6,321,495 B1 | 11/2001 | Oami |
| 6,336,767 B1 | 1/2002 | Nordquist et al. |
| 6,345,420 B1 | 2/2002 | Nabeshima |
| 6,349,904 B1 | 2/2002 | Polad |
| 6,351,380 B1 | 2/2002 | Curlee |
| 6,354,574 B1 | 3/2002 | Oliver et al. |
| 6,354,815 B1 | 3/2002 | Svihla et al. |
| 6,378,931 B1 | 4/2002 | Kolluri et al. |
| 6,398,449 B1 | 6/2002 | Loh |
| 6,470,540 B2 | 10/2002 | Aamodt et al. |
| 6,478,102 B1 | 11/2002 | Puterbaugh |
| 6,484,370 B2 | 11/2002 | Kanie et al. |
| 6,485,241 B1 | 11/2002 | Oxford |
| 6,498,297 B2 | 12/2002 | Samhammer |
| 6,523,229 B2 | 2/2003 | Severson |
| 6,523,817 B1 | 2/2003 | Landry, Jr. |
| 6,533,391 B1 | 3/2003 | Pan |
| 6,543,979 B2 | 4/2003 | Iwatsuki |
| 6,557,260 B1 | 5/2003 | Morris |
| 6,568,701 B1 | 5/2003 | Burdack et al. |
| 6,579,397 B1 | 6/2003 | Spain et al. |
| 6,591,801 B1 | 7/2003 | Fonville |
| 6,609,717 B2 | 8/2003 | Hinson |
| 6,637,095 B2 | 10/2003 | Stumpf et al. |
| 6,658,698 B2 | 12/2003 | Chen |
| 6,662,411 B2 | 12/2003 | Rubenstein |
| 6,664,470 B2 | 12/2003 | Nagamoto |
| 6,668,424 B1 | 12/2003 | Allen |
| 6,677,065 B2 | 1/2004 | Blauer |
| 6,692,016 B2 | 2/2004 | Yokota |
| 6,712,329 B2 | 3/2004 | Ishigami et al. |
| 6,746,172 B2 | 6/2004 | Culpepper |
| 6,757,942 B2 | 7/2004 | Matsui |
| 6,799,758 B2 | 10/2004 | Fries |
| 6,821,091 B2 | 11/2004 | Lee |
| 6,840,969 B2 | 1/2005 | Kobayashi et al. |
| 6,857,676 B2 | 2/2005 | Kawaguchi et al. |
| 6,857,809 B2 | 2/2005 | Granata |
| 6,872,053 B2 | 3/2005 | Bucher |
| 6,908,117 B1 | 6/2005 | Pickett, Jr. et al. |
| 6,932,416 B2 | 8/2005 | Clauson |
| 6,948,753 B2 | 9/2005 | Yoshida et al. |
| 6,951,349 B2 | 10/2005 | Yokota |
| 6,957,939 B2 | 10/2005 | Wilson |
| 6,959,954 B2 | 11/2005 | Brandt et al. |
| 6,966,601 B2 | 11/2005 | Matsumoto et al. |
| 6,971,831 B2 | 12/2005 | Fattori et al. |
| 6,997,487 B2 | 2/2006 | Kitzis |
| 7,000,941 B2 | 2/2006 | Yokota |
| 7,008,003 B1 | 3/2006 | Hirose et al. |
| 7,014,094 B2 | 3/2006 | Alcoe |
| 7,017,239 B2 | 3/2006 | Kurily et al. |
| 7,036,779 B2 | 5/2006 | Kawaguchi et al. |
| 7,055,785 B1 | 6/2006 | Diggle, III |
| 7,055,849 B2 | 6/2006 | Yokota |
| 7,059,628 B2 | 6/2006 | Yokota |
| 7,073,260 B2 | 7/2006 | Jensen |
| 7,089,998 B2 | 8/2006 | Crook |
| 7,097,198 B2 | 8/2006 | Yokota |
| 7,121,611 B2 | 10/2006 | Hirotani et al. |
| 7,144,183 B2 | 12/2006 | Lian et al. |
| 7,172,210 B2 | 2/2007 | Yokota |
| 7,178,855 B2 | 2/2007 | Catron et al. |
| 7,198,315 B2 | 4/2007 | Cass et al. |
| 7,207,758 B2 | 4/2007 | Leon et al. |
| 7,234,852 B2 | 6/2007 | Nishizawa et al. |
| 7,275,296 B2 | 10/2007 | Dicesare |
| 7,306,418 B2 | 12/2007 | Kornblum |
| 7,322,500 B2 | 1/2008 | Maierholzner |
| 7,344,056 B2 | 3/2008 | Shelmon et al. |
| 7,360,964 B2 | 4/2008 | Tsuya |
| 7,369,408 B2 | 5/2008 | Chang |
| 7,435,031 B2 | 10/2008 | Granata |
| 7,454,105 B2 | 11/2008 | Yi |
| 7,487,884 B2 | 2/2009 | Kim |
| 7,493,716 B2 | 2/2009 | Brown |
| 7,500,440 B2 | 3/2009 | Chiu |
| 7,547,061 B2 | 6/2009 | Horimatsu |
| 7,557,051 B2 | 7/2009 | Ryu et al. |

(56) References Cited

U.S. PATENT DOCUMENTS

| | | |
|---|---|---|
| 7,568,316 B2 | 8/2009 | Choby et al. |
| 7,591,573 B2 | 9/2009 | Maliar et al. |
| D602,349 S | 10/2009 | Andersson |
| 7,614,836 B2 | 11/2009 | Mohiuddin |
| 7,672,126 B2 | 3/2010 | Yeh |
| 7,677,650 B2 | 3/2010 | Huttenlocher |
| 7,727,667 B2 | 6/2010 | Sakurai |
| 7,764,853 B2 | 7/2010 | Yi et al. |
| 7,793,998 B2 | 9/2010 | Matsui et al. |
| 7,802,831 B2 | 9/2010 | Isayama et al. |
| 7,803,015 B2 | 9/2010 | Pham |
| 7,828,372 B2 | 11/2010 | Ellison |
| 7,832,693 B2 | 11/2010 | Moerke et al. |
| 7,862,272 B2 | 1/2011 | Nakajima |
| 7,869,003 B2 | 1/2011 | Van Doren et al. |
| 7,883,137 B2 | 2/2011 | Bar |
| 7,891,926 B2 | 2/2011 | Jackson, Jr. |
| 7,922,415 B2 | 4/2011 | Rudduck et al. |
| 7,946,684 B2 | 5/2011 | Drury et al. |
| 7,959,214 B2 | 6/2011 | Salhoff |
| 8,029,222 B2 | 10/2011 | Nitsche |
| 8,061,861 B2 | 11/2011 | Paxton et al. |
| 8,101,264 B2 | 1/2012 | Pace et al. |
| 8,136,819 B2 | 3/2012 | Yoshitsune et al. |
| 8,162,375 B2 | 4/2012 | Gurtatowski et al. |
| 8,203,496 B2 | 6/2012 | Miller et al. |
| 8,203,843 B2 | 6/2012 | Chen |
| 8,206,029 B2 | 6/2012 | Vaucher et al. |
| 8,228,640 B2 | 7/2012 | Woodhead et al. |
| 8,249,679 B2 | 8/2012 | Cui |
| 8,261,581 B2 | 9/2012 | Cerruti et al. |
| 8,263,889 B2 | 9/2012 | Takahashi et al. |
| 8,276,961 B2 | 10/2012 | Kwolek |
| 8,291,553 B2 | 10/2012 | Moberg |
| 8,297,137 B2 | 10/2012 | Dole |
| 8,297,661 B2 | 10/2012 | Proulx et al. |
| 8,312,887 B2 | 11/2012 | Dunn et al. |
| 8,371,788 B2 | 2/2013 | Lange |
| 8,414,048 B1 | 4/2013 | Kwolek |
| 8,424,173 B2 | 4/2013 | Shiba |
| 8,444,199 B2 | 5/2013 | Takeuchi et al. |
| 8,474,214 B2 | 7/2013 | Dawe |
| 8,480,186 B2 | 7/2013 | Wang |
| 8,511,707 B2 | 8/2013 | Amamori |
| 8,572,818 B2 | 11/2013 | Hofmann |
| 8,579,141 B2 | 11/2013 | Tejima |
| 8,619,504 B2 | 12/2013 | Wyssbrod |
| 8,677,573 B2 | 3/2014 | Lee |
| 8,695,201 B2 | 4/2014 | Morris |
| 8,720,016 B2 | 5/2014 | Beaulieu |
| 8,726,473 B2 | 5/2014 | Dole |
| 8,746,801 B2 | 6/2014 | Nakata |
| 8,773,846 B2 | 7/2014 | Wang |
| 8,811,004 B2 | 8/2014 | Liu |
| 8,826,499 B2 * | 9/2014 | Tempesta ............. A44B 19/267 24/401 |
| 8,833,771 B2 | 9/2014 | Lesnau |
| 8,833,832 B2 | 9/2014 | Whipps |
| 8,834,058 B2 | 9/2014 | Woicke |
| 8,905,812 B2 | 12/2014 | Pai-Chen |
| 8,910,350 B2 | 12/2014 | Poulakis |
| 9,003,891 B2 | 4/2015 | Frank |
| 9,039,318 B2 | 5/2015 | Mantei et al. |
| 9,050,690 B2 | 6/2015 | Hammer et al. |
| 9,061,403 B2 | 6/2015 | Colombo et al. |
| 9,061,715 B2 | 6/2015 | Morris |
| 9,062,991 B2 | 6/2015 | Kanagaraj |
| 9,067,625 B2 | 6/2015 | Morris |
| 9,194,413 B2 | 11/2015 | Christoph |
| 2001/0016986 A1 | 8/2001 | Bean |
| 2001/0030414 A1 | 10/2001 | Yokota |
| 2001/0045757 A1 | 11/2001 | Kanie et al. |
| 2002/0045086 A1 | 4/2002 | Tsuji et al. |
| 2002/0060275 A1 | 5/2002 | Polad |
| 2002/0092598 A1 | 7/2002 | Jones et al. |
| 2002/0130239 A1 | 9/2002 | Ishigami et al. |
| 2002/0136617 A1 | 9/2002 | Imahigashi |
| 2003/0007831 A1 | 1/2003 | Lian et al. |
| 2003/0059255 A1 | 3/2003 | Kirchen |
| 2003/0080131 A1 | 5/2003 | Fukuo |
| 2003/0082986 A1 | 5/2003 | Wiens et al. |
| 2003/0085618 A1 | 5/2003 | Rhodes |
| 2003/0087047 A1 | 5/2003 | Blauer |
| 2003/0108401 A1 | 6/2003 | Agha et al. |
| 2003/0180122 A1 | 9/2003 | Dobson |
| 2004/0016088 A1 * | 1/2004 | Angellotti ............... F16B 5/065 24/297 |
| 2004/0028503 A1 | 2/2004 | Charles |
| 2004/0037637 A1 | 2/2004 | Lian et al. |
| 2004/0052574 A1 | 3/2004 | Grubb |
| 2004/0131896 A1 | 7/2004 | Blauer |
| 2004/0139678 A1 | 7/2004 | Pervan |
| 2004/0140651 A1 | 7/2004 | Yokota |
| 2004/0208728 A1 | 10/2004 | Fattori et al. |
| 2004/0262873 A1 | 12/2004 | Wolf et al. |
| 2005/0016116 A1 | 1/2005 | Scherff |
| 2005/0031946 A1 | 2/2005 | Kruger et al. |
| 2005/0042057 A1 | 2/2005 | Konig et al. |
| 2005/0054229 A1 | 3/2005 | Tsuya |
| 2005/0082449 A1 | 4/2005 | Kawaguchi et al. |
| 2005/0109489 A1 | 5/2005 | Kobayashi |
| 2005/0156409 A1 | 7/2005 | Yokota |
| 2005/0156410 A1 | 7/2005 | Yokota |
| 2005/0156416 A1 | 7/2005 | Yokota |
| 2005/0217088 A1 | 10/2005 | Lin |
| 2005/0244250 A1 | 11/2005 | Okada et al. |
| 2006/0082187 A1 | 4/2006 | Hernandez et al. |
| 2006/0092653 A1 | 5/2006 | Tachiiwa et al. |
| 2006/0102214 A1 | 5/2006 | Clemons |
| 2006/0110109 A1 | 5/2006 | Yi |
| 2006/0113755 A1 | 6/2006 | Yokota |
| 2006/0125286 A1 | 6/2006 | Horimatsu et al. |
| 2006/0141318 A1 | 6/2006 | MacKinnon et al. |
| 2006/0163902 A1 | 7/2006 | Engel |
| 2006/0170242 A1 | 8/2006 | Forrester et al. |
| 2006/0197356 A1 | 9/2006 | Catron et al. |
| 2006/0202449 A1 | 9/2006 | Yokota |
| 2006/0237995 A1 | 10/2006 | Huttenlocher |
| 2006/0249520 A1 | 11/2006 | DeMonte |
| 2006/0264076 A1 | 11/2006 | Chen |
| 2007/0034636 A1 | 2/2007 | Fukuo |
| 2007/0040411 A1 | 2/2007 | Dauvergne |
| 2007/0051572 A1 | 3/2007 | Beri |
| 2007/0113483 A1 | 5/2007 | Hernandez |
| 2007/0113485 A1 | 5/2007 | Hernandez |
| 2007/0126211 A1 | 6/2007 | Moerke et al. |
| 2007/0137018 A1 | 6/2007 | Aigner et al. |
| 2007/0144659 A1 | 6/2007 | De La Fuente |
| 2007/0205627 A1 | 9/2007 | Ishiguro |
| 2007/0227942 A1 | 10/2007 | Hirano |
| 2007/0251055 A1 | 11/2007 | Gerner |
| 2007/0258756 A1 | 11/2007 | Olshausen |
| 2007/0274777 A1 | 11/2007 | Winkler |
| 2007/0292205 A1 | 12/2007 | Duval |
| 2008/0011930 A1 * | 1/2008 | Nagai ................. B60Q 3/0203 248/503 |
| 2008/0014508 A1 | 1/2008 | Van Doren et al. |
| 2008/0018128 A1 | 1/2008 | Yamagiwa et al. |
| 2008/0073888 A1 | 3/2008 | Enriquez |
| 2008/0094447 A1 | 4/2008 | Drury et al. |
| 2008/0128346 A1 | 6/2008 | Bowers |
| 2008/0196535 A1 | 8/2008 | Dole |
| 2008/0217796 A1 | 9/2008 | Van Bruggen et al. |
| 2008/0260488 A1 | 10/2008 | Scroggie et al. |
| 2009/0028506 A1 | 1/2009 | Yi et al. |
| 2009/0072591 A1 | 3/2009 | Baumgartner |
| 2009/0091156 A1 | 4/2009 | Neubrand |
| 2009/0093111 A1 | 4/2009 | Buchwalter et al. |
| 2009/0126168 A1 | 5/2009 | Kobe et al. |
| 2009/0134652 A1 | 5/2009 | Araki |
| 2009/0140112 A1 | 6/2009 | Carnevali |
| 2009/0141449 A1 | 6/2009 | Yeh |
| 2009/0154303 A1 | 6/2009 | Vaucher |
| 2009/0174207 A1 | 7/2009 | Lota |

(56) References Cited

U.S. PATENT DOCUMENTS

| | | |
|---|---|---|
| 2009/0211804 A1 | 8/2009 | Zhou |
| 2009/0243172 A1 | 10/2009 | Ting et al. |
| 2009/0265896 A1 | 10/2009 | Beak |
| 2009/0309388 A1 | 12/2009 | Ellison |
| 2010/0000156 A1 | 1/2010 | Salhoff |
| 2010/0001539 A1 | 1/2010 | Kikuchi et al. |
| 2010/0021267 A1 | 1/2010 | Nitsche |
| 2010/0061045 A1 | 3/2010 | Chen |
| 2010/0102538 A1 | 4/2010 | Paxton et al. |
| 2010/0134128 A1 | 6/2010 | Hobbs |
| 2010/0147355 A1 | 6/2010 | Shimizu et al. |
| 2010/0162537 A1 | 7/2010 | Shiba |
| 2010/0232171 A1 | 9/2010 | Cannon |
| 2010/0247034 A1 | 9/2010 | Yi et al. |
| 2010/0263417 A1 | 10/2010 | Shoenow |
| 2010/0270745 A1 | 10/2010 | Hurlbert et al. |
| 2010/0307848 A1 | 12/2010 | Hashimoto |
| 2011/0012378 A1 | 1/2011 | Ueno et al. |
| 2011/0036542 A1 | 2/2011 | Woicke |
| 2011/0076588 A1 | 3/2011 | Yamaura |
| 2011/0083392 A1 | 4/2011 | Timko |
| 2011/0103884 A1 | 5/2011 | Shiomoto et al. |
| 2011/0119875 A1 | 5/2011 | Iwasaki |
| 2011/0131918 A1 | 6/2011 | Glynn |
| 2011/0154645 A1 | 6/2011 | Morgan |
| 2011/0175376 A1 | 7/2011 | Whitens et al. |
| 2011/0183152 A1 | 7/2011 | Lanham |
| 2011/0191990 A1 | 8/2011 | Beaulieu |
| 2011/0191993 A1 | 8/2011 | Forrest |
| 2011/0239418 A1* | 10/2011 | Huang .................... F16B 5/065 24/592.11 |
| 2011/0296764 A1 | 12/2011 | Sawatani et al. |
| 2011/0311332 A1 | 12/2011 | Ishman |
| 2012/0000291 A1 | 1/2012 | Christoph |
| 2012/0000409 A1 | 1/2012 | Railey |
| 2012/0020726 A1 | 1/2012 | Jan |
| 2012/0073094 A1 | 3/2012 | Bishop |
| 2012/0112489 A1 | 5/2012 | Okimoto |
| 2012/0115010 A1 | 5/2012 | Smith et al. |
| 2012/0187812 A1 | 7/2012 | Gerst |
| 2012/0240363 A1 | 9/2012 | Lee |
| 2012/0251226 A1 | 10/2012 | Liu et al. |
| 2012/0261951 A1 | 10/2012 | Mildner et al. |
| 2012/0301067 A1 | 11/2012 | Morgan |
| 2012/0311829 A1 | 12/2012 | Dickinson |
| 2012/0321379 A1* | 12/2012 | Wang .................... F16B 5/0642 403/321 |
| 2012/0324795 A1 | 12/2012 | Krajenke et al. |
| 2013/0010413 A1 | 1/2013 | Kim |
| 2013/0017038 A1 | 1/2013 | Kestner et al. |
| 2013/0019454 A1 | 1/2013 | Colombo et al. |
| 2013/0019455 A1* | 1/2013 | Morris .................... B25B 27/00 29/466 |
| 2013/0027852 A1 | 1/2013 | Wang |
| 2013/0055822 A1 | 3/2013 | Frank |
| 2013/0071181 A1 | 3/2013 | Herzinger et al. |
| 2013/0157015 A1 | 6/2013 | Morris |
| 2013/0212858 A1 | 8/2013 | Herzinger et al. |
| 2013/0269873 A1 | 10/2013 | Herzinger et al. |
| 2013/0287992 A1 | 10/2013 | Morris |
| 2014/0033493 A1 | 2/2014 | Morris et al. |
| 2014/0041176 A1 | 2/2014 | Morris |
| 2014/0041185 A1 | 2/2014 | Morris et al. |
| 2014/0041199 A1 | 2/2014 | Morris |
| 2014/0042704 A1 | 2/2014 | Polewarczyk |
| 2014/0047691 A1 | 2/2014 | Colombo et al. |
| 2014/0047697 A1 | 2/2014 | Morris |
| 2014/0080036 A1 | 3/2014 | Smith et al. |
| 2014/0132023 A1 | 5/2014 | Watanabe |
| 2014/0157578 A1 | 6/2014 | Morris et al. |
| 2014/0159412 A1 | 6/2014 | Morris |
| 2014/0172112 A1 | 6/2014 | Marter |
| 2014/0175774 A1 | 6/2014 | Kansteiner |
| 2014/0199116 A1 | 7/2014 | Metten et al. |
| 2014/0202628 A1 | 7/2014 | Sreetharan et al. |
| 2014/0208561 A1 | 7/2014 | Colombo et al. |
| 2014/0208572 A1 | 7/2014 | Colombo et al. |
| 2014/0220267 A1 | 8/2014 | Morris et al. |
| 2014/0260041 A1* | 9/2014 | Peck .................... F16B 5/0685 52/489.1 |
| 2014/0264206 A1 | 9/2014 | Morris |
| 2014/0292013 A1 | 10/2014 | Colombo et al. |
| 2014/0298638 A1 | 10/2014 | Colombo et al. |
| 2014/0298640 A1 | 10/2014 | Morris et al. |
| 2014/0298962 A1 | 10/2014 | Morris et al. |
| 2014/0300130 A1 | 10/2014 | Morris et al. |
| 2014/0301103 A1 | 10/2014 | Colombo et al. |
| 2014/0301777 A1 | 10/2014 | Morris et al. |
| 2014/0301778 A1 | 10/2014 | Morris et al. |
| 2014/0360824 A1 | 12/2014 | Morris et al. |
| 2014/0360826 A1 | 12/2014 | Morris et al. |
| 2014/0366326 A1 | 12/2014 | Colombo et al. |
| 2014/0369742 A1 | 12/2014 | Morris et al. |
| 2014/0369743 A1 | 12/2014 | Morris et al. |
| 2015/0016864 A1 | 1/2015 | Morris et al. |
| 2015/0016918 A1 | 1/2015 | Colombo |
| 2015/0023724 A1 | 1/2015 | Morris et al. |
| 2015/0043959 A1 | 2/2015 | Morris |
| 2015/0050068 A1 | 2/2015 | Morris et al. |
| 2015/0052725 A1 | 2/2015 | Morris et al. |
| 2015/0056009 A1 | 2/2015 | Morris |
| 2015/0063943 A1 | 3/2015 | Morris |
| 2015/0069779 A1 | 3/2015 | Morris et al. |
| 2015/0078805 A1 | 3/2015 | Morris et al. |
| 2015/0086265 A1 | 3/2015 | Morris |
| 2015/0093177 A1* | 4/2015 | Morris .................... F16B 5/065 403/13 |
| 2015/0093178 A1* | 4/2015 | Morris .................... B62D 27/02 403/13 |
| 2015/0093179 A1 | 4/2015 | Morris et al. |
| 2015/0098748 A1 | 4/2015 | Morris et al. |
| 2015/0135509 A1 | 5/2015 | Morris et al. |
| 2015/0165609 A1 | 6/2015 | Morris et al. |
| 2015/0165985 A1 | 6/2015 | Morris |
| 2015/0165986 A1 | 6/2015 | Morris |
| 2015/0166124 A1 | 6/2015 | Morris |
| 2015/0167717 A1 | 6/2015 | Morris |
| 2015/0167718 A1 | 6/2015 | Morris et al. |
| 2015/0174740 A1 | 6/2015 | Morris et al. |
| 2015/0175091 A1 | 6/2015 | Morris et al. |
| 2015/0175217 A1 | 6/2015 | Morris et al. |
| 2015/0194650 A1* | 7/2015 | Morris .................... F16B 19/02 429/100 |
| 2015/0232130 A1* | 8/2015 | Colombo .............. F16B 5/0657 403/14 |
| 2015/0232131 A1* | 8/2015 | Morris .................... B62D 27/04 403/14 |
| 2015/0274217 A1* | 10/2015 | Colombo .............. F16B 5/0628 403/14 |
| 2015/0375797 A1* | 12/2015 | Morris .................... F16B 2/22 296/193.05 |
| 2015/0375798 A1* | 12/2015 | Morris .................... F16B 5/0628 403/14 |
| 2015/0377267 A1* | 12/2015 | Morris .................... F16B 5/07 403/287 |

FOREIGN PATENT DOCUMENTS

| | | |
|---|---|---|
| CN | 1129162 A | 8/1996 |
| CN | 2285844 Y | 7/1998 |
| CN | 1205285 A | 1/1999 |
| CN | 1204744 A | 7/1999 |
| CN | 1328521 A | 12/2001 |
| CN | 1426872 A | 7/2003 |
| CN | 1496451 A | 5/2004 |
| CN | 2661972 Y | 12/2004 |
| CN | 2679409 Y | 2/2005 |
| CN | 1670986 A | 9/2005 |
| CN | 100573975 C | 9/2005 |
| CN | 1693721 A | 11/2005 |
| CN | 1771399 A | 5/2006 |
| CN | 1774580 A | 5/2006 |
| CN | 2872795 Y | 2/2007 |

(56) References Cited

FOREIGN PATENT DOCUMENTS

| | | |
|---|---|---|
| CN | 1933747 A | 3/2007 |
| CN | 2888807 Y | 4/2007 |
| CN | 1961157 A | 5/2007 |
| CN | 2915389 Y | 6/2007 |
| CN | 101005741 A | 7/2007 |
| CN | 200941716 Y | 8/2007 |
| CN | 200957794 Y | 10/2007 |
| CN | 101250964 A | 4/2008 |
| CN | 101390022 A | 3/2009 |
| CN | 201259846 Y | 6/2009 |
| CN | 201268336 Y | 7/2009 |
| CN | 201310827 Y | 9/2009 |
| CN | 201540513 U | 8/2010 |
| CN | 101821534 | 9/2010 |
| CN | 101930253 A | 12/2010 |
| CN | 201703439 U | 1/2011 |
| CN | 201737062 U | 2/2011 |
| CN | 201792722 U | 4/2011 |
| CN | 201818606 U | 5/2011 |
| CN | 201890285 U | 7/2011 |
| CN | 102144102 A | 8/2011 |
| CN | 102235402 A | 11/2011 |
| CN | 202024057 U | 11/2011 |
| CN | 202079532 U | 12/2011 |
| CN | 102313952 A | 1/2012 |
| CN | 202132326 U | 2/2012 |
| CN | 102540855 A | 7/2012 |
| CN | 102756633 | 10/2012 |
| CN | 102803753 A | 11/2012 |
| CN | 202561269 U | 11/2012 |
| CN | 102817892 A | 12/2012 |
| CN | 102869891 A | 1/2013 |
| CN | 102904128 A | 1/2013 |
| CN | 202686206 U | 1/2013 |
| CN | 102939022 A | 2/2013 |
| CN | 202764872 U | 3/2013 |
| CN | 202987018 U | 6/2013 |
| CN | 103201525 A | 7/2013 |
| CN | 103206595 A | 7/2013 |
| CN | 103206596 A | 7/2013 |
| CN | 203189459 U | 9/2013 |
| CN | 203344856 U | 12/2013 |
| CN | 104100609 A | 10/2014 |
| CN | 203991175 U | 12/2014 |
| DE | 1220673 B | 7/1966 |
| DE | 2527023 A1 | 12/1976 |
| DE | 2736012 A1 | 2/1978 |
| DE | 2703897 A1 | 8/1978 |
| DE | 2809746 A1 | 9/1979 |
| DE | 3704190 A1 | 12/1987 |
| DE | 3711696 A1 | 10/1988 |
| DE | 3805693 A1 | 2/1989 |
| DE | 3815927 | 11/1989 |
| DE | 9109276 U1 | 7/1991 |
| DE | 4002443 A1 | 8/1991 |
| DE | 4111245 A1 | 10/1991 |
| DE | 9201258 U1 | 3/1992 |
| DE | 29714892 U1 | 10/1997 |
| DE | 29800379 U1 | 5/1998 |
| DE | 69600357 T2 | 12/1998 |
| DE | 10202644 C1 | 6/2003 |
| DE | 10234253 B3 | 4/2004 |
| DE | 10333540 A1 | 2/2005 |
| DE | 60105817 T2 | 2/2006 |
| DE | 202007006175 U1 | 8/2007 |
| DE | 102008005618 A1 | 7/2009 |
| DE | 102008063920 A1 | 9/2009 |
| DE | 102008047464 A1 | 4/2010 |
| DE | 102010028323 A1 | 11/2011 |
| DE | 102011050003 A1 | 10/2012 |
| DE | 102012212101 B3 | 7/2013 |
| DE | 102013003028 A1 | 3/2014 |
| EP | 0118796 | 9/1984 |
| EP | 0616140 A2 | 9/1994 |
| EP | 1132263 A1 | 9/2001 |
| EP | 1243471 A2 | 9/2002 |
| EP | 1273766 A1 | 1/2003 |
| EP | 1293384 A2 | 3/2003 |
| EP | 1384536 A2 | 1/2004 |
| EP | 1388449 A1 | 2/2004 |
| EP | 1452745 A1 | 9/2004 |
| EP | 1550818 A1 | 7/2005 |
| EP | 2166235 A2 | 3/2010 |
| EP | 2450259 A1 | 5/2012 |
| EP | 2458454 A1 | 5/2012 |
| FR | 1369198 A | 8/1964 |
| FR | 2009941 A1 | 2/1970 |
| FR | 2750177 A2 | 12/1997 |
| FR | 2942749 A1 | 9/2010 |
| FR | 2958696 A1 | 10/2011 |
| GB | 155838 | 3/1922 |
| GB | 994891 | 6/1965 |
| GB | 2175626 A | 12/1986 |
| GB | 2281950 A | 3/1995 |
| GB | 2348924 A | 10/2000 |
| JP | H08200420 A | 8/1996 |
| JP | H0942233 A | 2/1997 |
| JP | 2000010514 A | 1/2000 |
| JP | 2001141154 A | 5/2001 |
| JP | 2001171554 A | 6/2001 |
| JP | 2003158387 A | 5/2003 |
| JP | 2003314515 A | 11/2003 |
| JP | 2005268004 | 9/2005 |
| JP | 2006205918 | 8/2006 |
| JP | 2008307938 A | 12/2008 |
| JP | 2009084844 | 4/2009 |
| JP | 2009187789 A | 8/2009 |
| JP | 2011085174 A | 4/2011 |
| JP | 2012060791 A | 3/2012 |
| JP | 2012112533 A | 6/2012 |
| KR | 200300000251 A1 | 1/2003 |
| KR | 100931019 B1 | 12/2009 |
| WO | 9602963 A1 | 2/1996 |
| WO | 9822739 A1 | 5/1998 |
| WO | 0055517 A2 | 3/2000 |
| WO | 0132454 A3 | 11/2001 |
| WO | 2004010011 01 | 1/2004 |
| WO | 2007126201 A1 | 11/2007 |
| WO | 2008140659 A1 | 11/2008 |
| WO | 2010105354 A1 | 9/2010 |
| WO | 2011025606 | 3/2011 |
| WO | 2013088447 A1 | 6/2013 |
| WO | 2013191622 A1 | 12/2013 |

OTHER PUBLICATIONS

U.S. Appl. No. 13/940,912, filed Jul. 12, 2013, entitled "Alignment Arrangement for Mated Components and Method", inventors: Steven E. Morris and Jennifer P. Lawall.

U.S. Appl. No. 13/945,231, filed Jul. 18, 2013, entitled "Lobular Elastic Tube Alignment System for Providing Precise Four-Way Alignment of Components", Inventors: Steven E. Morris and Jennifer P. Lawall.

U.S. Appl. No. 13/954,198, filed Jul. 30, 2013, entitled "Elastic Alignment and Retention System and Method," inventors: Steven E. Morris, Edward D. Groninger, and Raymond J. Chess.

U.S. Appl. No. 13/966,523, filed Aug. 14, 2013, entitled "Elastically Averaged Alignment Systems and Methods Thereof," inventors: Steven E. Morris, Jennifer P. Lawall and Joel Colombo.

U.S. Appl. No. 13/973,587, filed Aug. 22, 2013, entitled "Elastic Averaging Alignment System and Method," inventors: Steven E. Morris and Jennifer P. Lawall.

U.S. Appl. No. 13/974,729, filed Aug. 23, 2013, entitled "Elastic Averaging Snap Member Aligning and Fastening System", inventors: Steven E. Morris and Jennifer P. Lawall.

U.S. Appl. No. 14/012,205, filed Aug. 28, 2013, entitled "Elastically Deformable Alignment Fastener and System," inventors: Steven E. Morris, Marc J. Tahnoose, Micheal E. McGuire and Jennifer P. Lawall.

U.S. Appl. No. 14/021,282, filed Sep. 9, 2013, entitled "Elastic Tube Alignment and Fastening System for Providing Precise Alignment and Fastening of Components," inventors: Steven E. Morris and Jennifer P. Lawall.

(56) References Cited

OTHER PUBLICATIONS

U.S. Appl. No. 14/031,647, filed Sep. 19, 2013, entitled "Elastically Averaged Alignment Systems and Methods," inventors: Steven E. Morris, Joel Colombo, Jennifer P. Lawall, Jeffrey L. Konchan, and Steven J. Briggs.
U.S. Appl. No. 14/038,241, filed Sep. 26, 2013, entitled "Serviceable Aligning and Self-Retaining Elastic Arrangement for Mated Component and Method," inventors: Steven E. Morris, Jennifer P. Lawall and Joel Colombo.
U.S. Appl. No. 14/039,614, filed Sep. 27, 2013, entitled "Elastically Averaged Alignment Systems and Methods," inventor: Steven E. Morris.
U.S. Appl. No. 14/044,199, filed Oct. 2, 2013, entitled "Lobular Elastic Tube Alignment and Retention System for Providing Precise Alignment of Components," inventors: Steven E. Morris and Jennifer P. Lawall.
U.S. Appl. No. 14/044,207, filed Oct. 2, 2013, entiled "Elastic Aperture Alignment System for Providing Precise Four-Way Alignment of Components," inventors: Steven E. Morris and Jennifer P. Lawall.
U.S. Appl. No. 14/045,463, filed Oct. 3, 2013, entitled "Elastically Averaged Alignment Systems and Methods," inventors: Steven E. Morris and Jennifer P. Lawall.
U.S. Appl. No. 14/081,361, filed Nov. 15, 2013, entitled "Elastically Deformable Clip and Method," inventors: Steven E. Morris, Jennifer P. Lawall and Jeffrey M. Gace.
U.S. Appl. No. 14/104,321, filed Dec. 12, 2013, entitled "Alignment and Retention System for a Flexible Assembly," inventors: Steven E. Morris and Jennifer P. Lawall.
U.S. Appl. No. 14/104,327, filed Dec. 12, 2013, entitled "Self-Retaining Alignment System for Providing Precise Alignment and Retention of Components," inventors: Steven E. Morris, Jennifer P. Lawall and Toure D. Lee.
U.S. Appl. No. 14/104,333, filed Dec. 12, 2013, entitled "Alignment System for Providing Precise Alignment and Retention of Components of a Sealable Compartment," inventors: Steven E. Morris, Christopher J. Georgi, Jennifer P. Lawall and Gordan N. Noll.
U.S. Appl. No. 14/104,541, filed Dec. 12, 2013, entitled "Alignment and Retention System for Providing Precise Alignment and Retention of Components," inventors: Steven E. Morris and Jennifer P. Lawall.
U.S. Appl. No. 14/104,549, filed Dec. 12, 2013, entitled "Alignment System for Providing Alignment of Components Having Contoured Features," inventors: Steven E. Morris and Jennifer P. Lawall.
U.S. Appl. No. 14/108,921, filed Dec. 17, 2013, entitled "Elastically Averaged Alignment Systems and Methods Thereof," inventors: Steven E. Morris and Jennifer P. Lawall.
U.S. Appl. No. 14/108,931, filed Dec. 17, 2013, entitled "Elastically Averaged Strap Systems and Methods," inventors: Steven E. Morris and Jennifer P. Lawall.
U.S. Appl. No. 14/109,296, filed Dec. 17, 2013, entitled "Fastener for Operatively Coupling Matable Components," inventors: Steven E. Morris and Jennifer P. Lawall.
U.S. Appl. No. 14/134,622, filed Dec. 19, 2013, entitled "Elastic Averaging Alignment Member," inventors: Steven E. Morris and Jennifer P. Lawall.
U.S. Appl. No. 14/134,801, filed Dec. 19, 2013, entitled "Elastically Averaged Alignment Systems and Methods," inventors: Steven E. Morris and Jennifer P. Lawall.
U.S. Appl. No. 14/134,844, filed Dec. 19, 2013, entitled "Elastically Deformable Module Installation Assembly," inventors: Steven E. Morris and Jennifer P. Lawall.
U.S. Appl. No. 14/134,888, filed Dec. 19, 2013, entitled "Elastic Retaining Assembly and Method," inventors: Steven E. Morris and Jennifer P. Lawall.
U.S. Appl. No. 14/136,502, filed Dec. 20, 2013, entitled "Elastically Averaged Alignment Systems and Methods," inventors: Timothy A. Kiester, Steven E. Morris, Kenton L. West, Scott J. Fast, and Evan Phillips.

U.S. Appl. No. 14/151,279, filed Jan. 9, 2014, entitled "Elastically Averaged Alignment Systems and Methods," inventors: Steven E. Morris and Jennifer P. Lawall.
U.S. Appl. No. 14/153,741, filed Jan. 13, 2014, entitled "Elastically Averaged Assembly for Closure Applications," inventors: Steven E. Morris, Jeffrey A. Abell, Jennifer P. Lawall, and Jeffrey L. Konchan.
U.S. Appl. No. 14/180,882, filed Feb. 14, 2014, entitled "Elastic Tube Alignment System for Precisely Locating Components," inventor: Steven E. Morris.
U.S. Appl. No. 14/181,142, filed Feb. 14, 2014, entitled "Elastic Tube Alignment System for Precisely Locating Components," inventor: Steven E. Morris.
U.S. Appl. No. 14/185,422, filed Feb. 20, 2014, entitled "Elastically Averaged Alignment Systems and Methods," inventors: Joel Colombo, Steven E Morris, Jennifer P. Lawall and Ashish M. Gollapalli.
U.S. Appl. No. 14/185,472, filed Feb. 20, 2014, entitled "Elastically Averaged Alignment Systems and Method," inventors: Steven E. Morris, Jennifer P. Lawall and Kee Hyuk Im.
U.S. Appl. No. 14/231,395, filed Mar. 31, 2014, entitled "Elastically Averaged Alignment Systems and Methods," inventors: Joel Colombo, Steven E. Morris, Jennifer P. Lawall, and Ashish M. Gollapalli.
U.S. Appl. No. 14/249,746, filed Apr. 10, 2014, entitled "Elastically Averaged Alignment Systems and Methods," inventors: Joel Colombo and Catherine A. Ostrander.
U.S. Appl. No. 14/259,747, filed Apr. 23, 2014, entitled "System for Elastically Averaging Assembly of Components," inventors: Steven E. Morris and Jennifer P. Lawall.
Cross-sectional view of a prior art infrared welded assembly of BMW, Munich, Germany. Believed on the market since about Jan. 1, 2010.
"Coupling Types—Elastic Averaging." MIT. Aug. 3, 2012, [online], [retrieved on Nov. 12, 2014]. Retrieved from the Internet <URL:https://web.archive.org/web/20120308055935/http://pergatory.mit.edu/kinematiccouplings/html/about/elastic_averaging.html>.
"Elastic Averaging in Flexture Mechanisms: A Multi-Beam Paralleaogram Flexture Case-Study" by Shorya Awtar and Edip Sevincer, Proceedings of IDETC/CIE 2006, Paper DETC2006-99752, American Society of Mechanical Engineers (ASME), Sep. 2006.
"An Anti Backlash Two-Part Shaft Coupling With Interlocking Elastically Averaged Teeth" by Mahadevan Balasubramaniam, Edmund Golaski, Seung-Kil Son, Krishnan Sriram, and Alexander Slocum, Precision Engineering, V. 26, No. 3, Elsevier Publishing, Jul. 2002.
"The Design of High Precision Parallel Mechnisms Using Binary Actuation and Elastic Averaging: With Application to MRI Cancer Treatment" by L.M. Devita, J.S. Plante, and S. Dubowsky, 12th IFToMM World Congress (France), Jun. 2007.
"Passive Alignment of Micro-Fluidic Chips Using the Principle of Elastic Averaging" by Sitanshu Gurung, Thesis, Louisiana State University, Dept. of Mechanical Engineering, Dec. 2007.
"Precision Connector Assembly Using Elastic Averaging" by Patrick J. Willoughby and Alexander H. Slocum, Massachusetts Institute of Technology (MIT), Cambridge, MA, American Society for Precision Engineering, 2004.
U.S. Appl. No. 13/229,926, filed Sep. 12, 2011, entitled "Using Elastic Averaging for Alignment of Battery Stack, Fuel Cell Stack, or Other Vehicle Assembly", inventors: Mark A. Smith, Ronald Daul, Xiang Zhao, David Okonski, Elmer Santos, Lane Lindstrom, and Jeffrey A. Abell.
U.S. Appl. No. 13/330,718, filed Dec. 20, 2011, entitled "Precisely Locating Components in an Infrared Welded Assembly", inventor: Steven E. Morris.
U.S. Appl. No. 13/459,118, filed Apr. 28, 2012, entitled "Stiffened Multi-Layer Compartment Door Assembly Utilizing Elastic Averaging," inventor: Steven E. Morris.
U.S. Appl. No. 13/567,580, filed Aug. 6, 2012, entitled "Semi-Circular Alignment Features of an Elastic Averaging Alignment System", inventors: Steven E. Morris and Thomas F. Bowles.

(56) References Cited

OTHER PUBLICATIONS

U.S. Appl. No. 13/570,959, filed Aug. 9, 2012, entitled "Elastic Cantilever Beam Alignment System for Precisely Aligning Components", inventor: Steven E. Morris.
U.S. Appl. No. 13/571,030, filed Aug. 9, 2012, entitled "Elastic Tube Alignment System for Precisely Locating an Emblem Lens to an Outer Bezel", inventors: Joel Colombo, Steven E. Morris, and Michael D. Richardson.
U.S. Appl. No. 13/752,449, filed Jan. 29, 2013, entitled "Elastic Insert Alignment Assembly and Method of Reducing Positional Variation", inventors: Steven E. Morris and Michael D. Richardson.
U.S. Appl. No. 13/755,759, filed Jan. 31, 2013, entitled "Elastic Alignment Assembly for Aligning Mated Components and Method of Reducing Positional Variation", inventors: Joel Colombo, Michael D. Richardson, and Steven E. Morris.
U.S. Appl. No. 13/851,222, filed Mar. 27, 2013, entitled "Elastically Averaged Alignment System", inventors: Joel Colombo and Steven E. Morris.
U.S. Appl. No. 13/855,928, filed Apr. 3, 2013, entitled "Elastic Averaging Alignment System, Method of Making the Same and Cutting Punch Therefor", inventors: Steven E. Morris, Jennifer P. Lawall, Joel Colombo, and Jeffrey L. Konchan.
U.S. Appl. No. 13/856,888, filed Apr. 4, 2013, entitled "Elastic Retaining Assembly for Matable Components and Method of Assembling", inventors: Steven E. Morris, Jennifer P. Lawall, Joel Colombo, and Toure D. Lee.
U.S. Appl. No. 13/856,927, filed Apr. 4, 2013, entitled "Elastic Tubular Attachment Assembly for Mating Components and Method of Mating Components", inventors: Steven E. Morris and Jennifer P. Lawall.
U.S. Appl. No. 13/856,956, filed Apr. 4, 2013, entitled "Elastic Clip Retaining Arrangement and Method of Mating Structures with an Elastic Clip Retaining Arrangement", inventors: Joel Colombo, Steven E. Morris and Jeffrey L. Konchan.
U.S. Appl. No. 13/856,973, filed Apr. 4, 2013, entitled "Elastically Deformable Flange Locator Arrangement and Method of Reducing Positional Variation", inventors: Joel Colombo, Steven E. Morris and Michael D. Richardson.
U.S. Appl. No. 13/858,478, filed Apr. 8, 2013, entitled "Elastic Mating Assembly and Method of Elastically Assembling Matable Components", inventors: Steven E. Morris and Jennifer P. Lawall.
U.S. Appl. No. 13/859,109, filed Apr. 9, 2013, entitled "Elastic Retaining Arrangement for Jointed Components and Method of Reducing a Gap Between Jointed Components," inventors: Steven E. Morris, James M. Kushner, Victoria L. Enyedy, Jennifer P. Lawall, and Piotr J. Ogonek.
U.S. Appl. No. 13/915,132, filed Jun. 11, 2013, entitled "Elastically Deformable Energy Management Arrangement and Method of Managing Energy Absorption," inventors: Steven E. Morris, Randy A. Johnson and Jennifer P. Lawall.
U.S. Appl. No. 13/915,177, filed Jun. 11, 2013, entitled "Elastically Deformable Energy Management Assembly and Method of Managing Energy Absorption," inventors: Steven E. Morris, Jennifer P. Lawall and Randy Johnson.
U.S. Appl. No. 13/917,005, filed Jun. 13, 2013, entitled "Elastic Attachment Assembly and Method of Reducing Positional Variation and Increasing Stiffness," inventors: Steven E. Morris and Jennifer P. Lawall.
U.S. Appl. No. 13/917,074, filed Jun. 13, 2013, entitled "Elastically Deformable Retaining Hook for Components to be Mated Together and Method of Assembling", inventors: Joel Colombo, Jeffrey L. Konchan, Steven E. Morris, and Steve J. Briggs.
U.S. Appl. No. 13/918,183, filed Jun. 14, 2013, entitled "Elastic Retaining Assembly for Matable Components and Method of Assembling," inventors: Steven E. Morris and Jennifer P. Lawall.
Office Action regarding related CN App. No. 201401791906; dated May 27, 2016; 5 pgs.

\* cited by examiner

ELASTICALLY DEFORMABLE MODULE INSTALLATION ASSEMBLY

FIELD OF THE INVENTION

The present invention relates to an installation assembly for a module. More particularly, the installation assembly includes elastically deformable components that facilitate precise and robust installation of a module with a retaining bracket.

BACKGROUND

Currently, components which are to be mated together in a manufacturing process are subject to positional variation based on the mating arrangements between the components. One common arrangement includes components mutually located with respect to each other by 2-way and/or 4-way male alignment features; typically undersized structures which are received into corresponding oversized female alignment features such as apertures in the form of openings and/or slots. Alternatively, double-sided tape, adhesives or welding processes may be employed to mate parts. Additionally, rigid tabs or retaining components may be used to engage and secure a rigid mating component thereto. Irrespective of the precise mating arrangement, there is a clearance between at least a portion of the alignment features which is predetermined to match anticipated size and positional variation tolerances of the mating features as a result of manufacturing (or fabrication) variances. As a result, occurrence of significant positional variations between the mated components is possible, which may contribute to the presence of undesirably large and varying gaps and otherwise poor fit. The clearance between the aligning and attaching features may lead to relative motion between mated components, which contribute to poor perceived quality. Additional undesirable effects may include squeaking and rattling of the mated components, for example.

One assembly relates to an electrical module assembly that employs one or more brackets that include rigid tabs configured to retain a module by snap-fitting over an end or recess of the module. Due to the manufacturing issues described above, wear, looseness, noise and module separation are all issues that may arise. This is due in significant part to vibration of the components with contamination in the mating joint leading to bracket wear.

SUMMARY OF THE INVENTION

In one exemplary embodiment, an elastically deformable module installation assembly includes a base structure having a base portion, a first bracket and a second bracket, the base portion disposed substantially in a base plane, the first bracket extending substantially perpendicularly from the base portion, and the second bracket extending substantially perpendicularly from the base portion, wherein the first bracket is a substantially T-shaped member having a main portion, a pair of downwardly extending wing portions and a pair of recesses defined by the pair of downwardly extending wing portions and a segment of the main portion. Also included is a module configured to be mated with the base structure, the module including a first module end and a second module end, wherein the first module end includes a first pair of protrusions formed of an elastically deformable material and configured to be rotated into an interference condition with the first bracket upon insertion into the pair of recesses of the first bracket.

In another exemplary embodiment, an elastically deformable module installation assembly includes a base structure. The base structure includes a base portion disposed substantially in a base plane. The base structure also includes a first bracket and a second bracket, the first bracket extending substantially perpendicularly from the base portion, the second bracket extending substantially perpendicularly from the base portion, wherein the first bracket and the second bracket are each substantially T-shaped members having respective main portions, respective pairs of downwardly extending wing portions and respective pairs of recesses defined by the pairs of downwardly extending wing portions and a segment of the main portions. The assembly also includes a module configured to be mated with the base structure. The module includes a first module end and a second module end, wherein the first module end includes a first pair of protrusions formed of an elastically deformable material and configured to be rotated into an interference condition with the first bracket upon insertion into the pair of recesses of the first bracket, wherein each of the first pair of protrusions comprises a protrusion width and the pair of recesses of the first bracket comprises a recess width, the protrusion width being greater than the recess width. The module also includes a second pair of protrusions extending from the second module end, the second pair of protrusions configured to be rotated downwardly into an interference condition with a pair of outer edges of the second bracket.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

The following description is merely exemplary in nature and is not intended to limit the present disclosure, its application or uses. For example, the embodiments shown comprise vehicle components but the alignment and retention system may be used with any suitable components to provide elastic averaging for precision location, alignment and retention of all manner of mating components and component applications, including many industrial, consumer product (e.g., consumer electronics, various appliances and the like), transportation, energy and aerospace applications, and particularly including many other types of vehicular components and applications, such as various interior, exterior and under hood vehicular components and applications. It should be understood that throughout the drawings, corresponding reference numerals indicate like or corresponding parts and features.

As used herein, the term "elastically deformable" refers to components, or portions of components, including component features, comprising materials having a generally elastic deformation characteristic, wherein the material is configured to undergo a resiliently reversible change in its shape, size, or both, in response to application of a force. The force causing the resiliently reversible or elastic deformation of the material may include a tensile, compressive, shear, bending or torsional force, or various combinations of these forces. The elastically deformable materials may exhibit linear elastic deformation, for example that described according to Hooke's law, or non-linear elastic deformation.

Elastic averaging provides elastic deformation of the interface(s) between mated components, wherein the average deformation provides a precise alignment, the manufacturing positional variance being minimized to $X_{min}$, defined by $X_{min} = X/\sqrt{N}$, wherein X is the manufacturing positional variance of the locating features of the mated components and N is the number of features inserted. To obtain elastic averaging, an elastically deformable component is configured to have at least one feature and its contact surface(s) that is over-constrained and provides an interference fit with a mating feature of another component and its contact surface(s). The over-constrained condition and interference fit resiliently reversibly (elastically) deforms at least one of the at least one feature or the mating feature, or both features. The resiliently reversible nature of these features of the components allows repeatable insertion and withdrawal of the components that facilitates their assembly and disassembly. In some embodiments, the elastically deformable component configured to have the at least one feature and associated mating feature disclosed herein may require more than one of such features, depending on the requirements of a particular embodiment. Positional variance of the components may result in varying forces being applied over regions of the contact surfaces that are over-constrained and engaged during insertion of the component in an interference condition. It is to be appreciated that a single inserted component may be elastically averaged with respect to a length of the perimeter of the component. The principles of elastic averaging are described in detail in commonly owned, co-pending U.S. patent application Ser. No. 13/187,675, now U.S. Publication No. U.S. 2013/0019455, the disclosure of which is incorporated by reference herein in its entirety. The embodiments disclosed above provide the ability to convert an existing component that is not compatible with the above-described elastic averaging principles, or that would be further aided with the inclusion of an elastically averaged alignment and retention system as herein disclosed, to an assembly that does facilitate elastic averaging and the benefits associated therewith.

Any suitable elastically deformable material may be used for the mating components and alignment features disclosed herein and discussed further below, particularly those materials that are elastically deformable when formed into the features described herein. This includes various metals, polymers, ceramics, inorganic materials or glasses, or composites of any of the aforementioned materials, or any other combinations thereof suitable for a purpose disclosed herein. Many composite materials are envisioned, including various filled polymers, including glass, ceramic, metal and inorganic material filled polymers, particularly glass, metal, ceramic, inorganic or carbon fiber filled polymers. Any suitable filler morphology may be employed, including all shapes and sizes of particulates or fibers. More particularly any suitable type of fiber may be used, including continuous and discontinuous fibers, woven and unwoven cloths, felts or tows, or a combination thereof. Any suitable metal may be used, including various grades and alloys of steel, cast iron, aluminum, magnesium or titanium, or composites thereof, or any other combinations thereof. Polymers may include both thermoplastic polymers or thermoset polymers, or composites thereof, or any other combinations thereof, including a wide variety of co-polymers and polymer blends. In one embodiment, a preferred plastic material is one having elastic properties so as to deform elastically without fracture, as for example, a material comprising an acrylonitrile butadiene styrene (ABS) polymer, and more particularly a polycarbonate ABS polymer blend (PC/ABS). The material may be in any form and formed or manufactured by any suitable process, including stamped or formed metal, composite or other sheets, forgings, extruded parts, pressed parts, castings, or molded parts and the like, to include the deformable features described herein. The elastically deformable alignment features and associated component may be formed in any suitable manner. For example, the elastically deformable alignment features and the associated component may be integrally formed, or they may be formed entirely separately and subsequently attached together. When integrally formed, they may be formed as a single part from a plastic injection molding machine, for example. When formed separately, they may be formed from different materials to provide a predetermined elastic response characteristic, for example. The material, or materials, may be selected to provide a predetermined elastic response characteristic of any or all of the elastically deformable alignment features, the associated component, or the mating component. The predetermined elastic response characteristic may include, for example, a predetermined elastic modulus.

As used herein, the term vehicle is not limited to just an automobile, truck, van or sport utility vehicle, but includes any self-propelled, towed, or movable conveyance suitable for transporting or supporting a burden.

Figure 1:
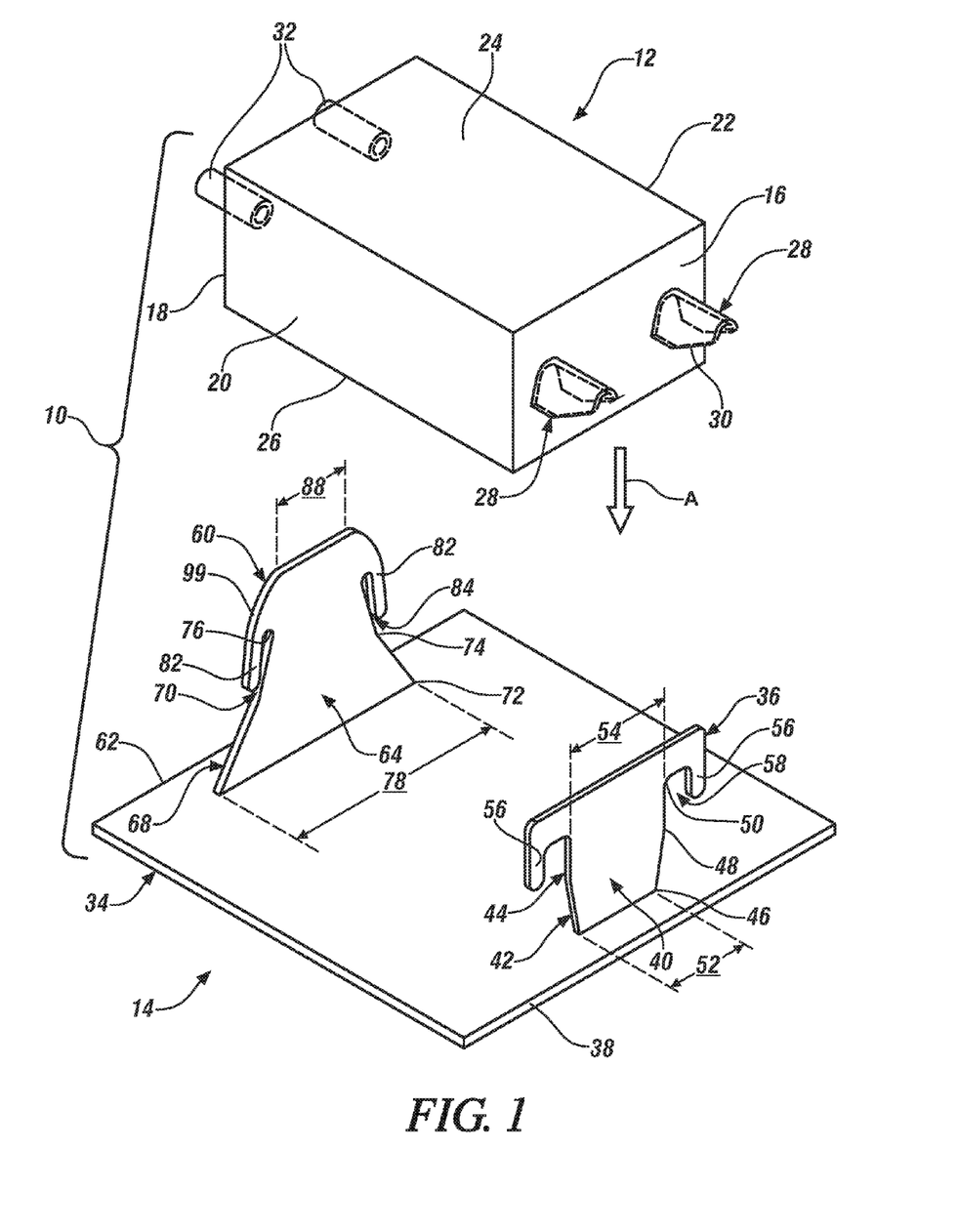
FIG. 1 is a perspective view of an elastically deformable module installation assembly having a module and a base structure in a pre-assembled condition.

Referring to FIG. 1, an elastically deformable module installation assembly 10 is illustrated. The elastically deformable module installation assembly 10 comprises matable components, such as a first component and a second component that are configured to be mated and aligned with respect to each other. In an exemplary embodiment such as the aforementioned vehicle application, the first component comprises a module 12, such as an electrical control module, and the second component comprises a base structure 14 for mounting the module 12 thereto. Mounting of the module 12 to the base structure 14 facilitates installation of the module 12 to a desired location.

Although illustrated in a specific geometry, the module 12 and the base structure 14 may be configured in numerous geometry variants. Regardless of the precise geometry of the module 12 and the base structure 14, the module 12 is configured to align and fittingly mate with the base structure 14, which will be described in detail below. It is to be appreciated that the elastically deformable module installation assembly 10 is to be employed for providing a self-aligning relationship between components, such as the module 12 and the base structure 14, to each other, while also assisting in securely mating the components to each other, thereby preventing relative motion.

The module 12 is illustrated as a substantially box-like structure, but it is to be understood that several alternative embodiments may suitably replace the illustrated embodiment. In the illustrated embodiment, the module includes a first module end 16, a second module end 18, a first side surface 20, a second side surface 22, a top surface 24 and a bottom surface 26. Some or all of the ends and surfaces may be substantially planar surfaces. The module 12 also includes a first pair of protrusions 28 extending from the first module end 16 in a direction relatively orthogonal from a plane that the first module end 16 is disposed in. Each of the first pair of protrusions 28 are operatively coupled to the first module end 16 and may be integrally formed with the first module end 16. The first pair of protrusions 28 may be formed in numerous contemplated embodiments. In the illustrated embodiment, each of the first pair of protrusions 28 are formed as substantially U-shaped protrusions, with the closed end of the U oriented towards the top surface 24 of the module 12. The first pair of protrusions 28 may be referred to as "horseshoe-shaped" features. As shown, the first pair of protrusions 28 may include an angled region 30 configured to facilitate insertion of the protrusions into female mating components, as will be described in detail below. Alternatively, the first pair of protrusions 28 may be formed in an alternative geometry, such as relatively tubular members. Further, the first pair of protrusions 28 may comprise a solid cylindrical member.

The module 12 also includes a second pair of protrusions 32 extending from the second module end 18 in a direction relatively orthogonal from a plane that the second module end 18 is disposed in. Each of the second pair of protrusions 32 are operatively coupled to the second module end 18 and may be integrally formed with the second module end 18. The second pair of protrusions 32 may be formed in numerous contemplated embodiments. In the illustrated embodiment, each of the second pair of protrusions 32 are tubular members with a hollow region. However, as described above in relation to the first pair of protrusions 28, the second pair of protrusions 32 may be formed as a solid cylindrical member or a substantially U-shaped (e.g., "horseshoe-shaped") feature, for example.

Regardless of the precise configuration of the first pair of protrusions 28 and the second pair of protrusions 32, they are formed of an elastically deformable material that, in combination with the features described herein, facilitates precise alignment of the module 12 relative to the base structure 14 by accounting for positional variation of the retaining and/or locating features of the module 12 and the base structure 14 inherently present due to manufacturing processes. The self-aligning benefits, enhanced stiffness and retention associated with the elastically deformable module installation assembly 10 will be described in detail below.

The base structure 14 includes a base portion 34 that is substantially disposed in a base plane. A first bracket 36 may be operatively coupled to the base portion 34 proximate a first end 38 of the base portion 34. The first bracket 36 extends substantially perpendicularly from the base portion 34 and may be integrally formed with the base portion 34. The first bracket 36 is a substantially T-shaped member having a main portion 40 comprising a first portion 42 and a second portion 44. The first portion 42 includes two edges that each extend from a first end 46 to a second end 48 that corresponds to an intermediate point along the entire length of the main portion 40. The edges of the first portion 42 extend in a substantially linear orientation at a first angle that corresponds to a widening of the first portion 42 in a direction from the first end 46 to the second end 48. The second portion 44 of the main portion 40 includes two edges that extend from the second end 48 of the first portion 42 to a terminal end 50 of the main portion 40. The edges of the second portion 44 extend in a substantially linear orientation at a second angle that is distinct from the first angle of the first portion 42. Irrespective of the precise angles of the first portion 42 and the second portion 44, relative to the base portion 34 of the base structure 14, the main portion 40 includes a first bracket width 52 at a first bracket end that is narrower than a second bracket width 54 at a second bracket end. The first bracket 36 also includes a pair of downwardly extending wing portions 56. The downwardly extending wing portions 56 and a portion of the edges of the second portion 44 define a pair of recesses 58. Specifically, each of the pair of recesses 58 extends from the terminal end 50 of the main portion 40.

Figure 3:
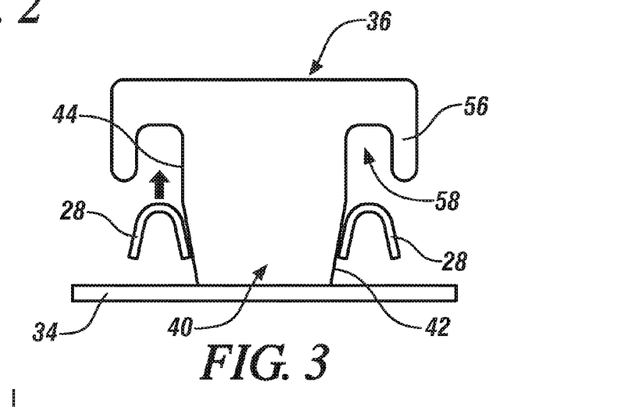
FIG. 3 is a partially schematic first end view of the module and the base structure of FIG. 1 in the partially assembled condition of FIG. 2.
Figure 4:
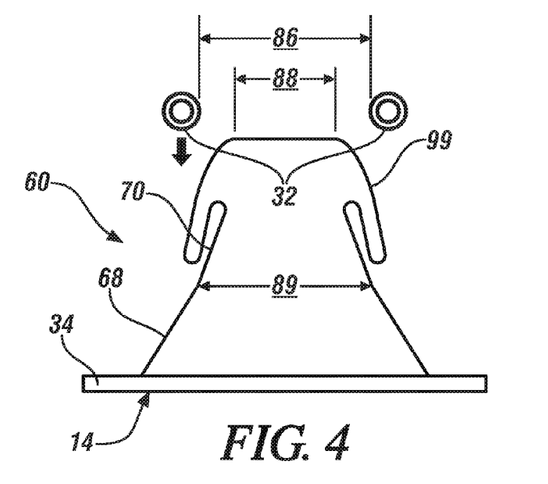
FIG. 4 is a partially schematic second end view of the module and the base structure of FIG. 1 in the partially assembled condition of FIG. 2.

The base structure 14 may also include a second bracket 60 that is operatively coupled to the base portion 34 proximate a second end 62 of the base portion 34. The second bracket 60 extends substantially perpendicularly from the base portion 34 and may be integrally formed with the base portion 34. The second bracket 60 is a substantially T-shaped member having a main portion 64 comprising a first portion 68 and a second portion 70. The first portion 68 includes two edges that each extend from a first end 72 to a second end 74 that corresponds to an intermediate point along the entire length of the main portion 64. The edges of the first portion 68 extend in a substantially linear orientation at a first angle that corresponds to a narrowing of the first portion 68 in a direction from the first end 72 to the second end 74. The second portion 70 of the main portion 64 includes two edges that extend from the second end 74 of the first portion 68 to a terminal end 76 of the main portion 64. The edges of the second portion 70 extend in a substantially linear orientation at a second angle that is distinct from the first angle of the first portion 68. The distinct angles of the first portion 68 and the second portion 70 form a depression at the second end 74 where the second pair of protrusions 32 are positioned in a fully engaged condition, as will be described in detail below. Irrespective of the precise angles of the first portion 68 and the second portion 70, relative to the base portion 34 of the base structure 14, the main portion 64 includes a first bracket width 78 at a first bracket end that is wider than a second bracket width at a second bracket end. The second bracket 60 also includes a pair of downwardly extending wing portions 82. The downwardly extending wing portions 82 and a portion of the edges of the second portion 70 define a pair of recesses 84. Specifically, each of the pair of recesses 84 extends from the terminal end 76 of the main portion 64. In contrast to the wing portions 56 of the first bracket 36, the wing portions 82 of the second bracket 60 extend outwardly in addition to downwardly (FIGS. 3 and 4). This provides a lead-in surface 99 for the second pair of protrusions 32 to engage and slide over during installation of the module and, more particularly, during downward rotation of the second module end 18.

The elastically deformable module installation assembly 10 is shown in FIG. 1 in a pre-assembled condition. Arrow A represents the general direction of initial movement of the module 12 during installation of the module 12 to the base structure 14.

Figure 2:
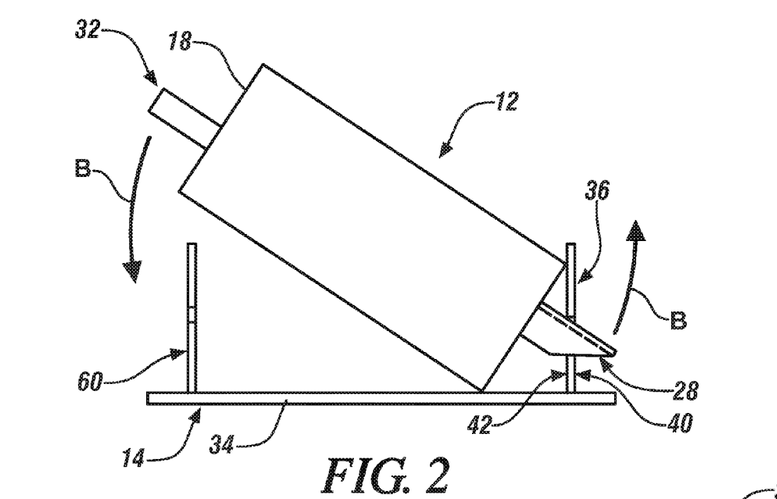
FIG. 2 is a side view of the module and the base structure of FIG. 1 in a partially assembled condition.

Reference is now made to FIGS. 2-8, which depict detail of the module 12 in various stages of engagement and assembly with the base structure. In particular, FIGS. 2-4 illustrate the module 12 in a partially assembled condition with the base structure 14, while FIGS. 5-8 illustrate the module 12 in a fully assembled condition with the base structure 14. Specific details regarding each condition (i.e., partially and fully assembled) will be described below.

The module 12 is disposed at an angle when moved into close proximity with the base structure 14 (FIG. 2). Such an angle of insertion facilitates positioning of the first pair of protrusions 28 into close proximity with the base portion 34 of the base structure 14, as well as into close proximity with the main portion 40 the first bracket 36. More particularly, the first pair of protrusions 28 are positioned closely to, or placed in contact with, the edges of the first portion 42 of the main portion 40. The narrower width of the first portion 42 of the main portion 40, relative to the second portion 44, is sized to ensure that the spacing of the first pair of protrusions 28 is sufficient to pass over the edges of the main portion 40 (FIG. 3).

In the illustrated condition, the second module end 18 and, more particularly, the second pair of protrusions 32 are positioned at a location proximate the top of the second bracket 60 (FIGS. 2 and 4). To ensure the imposition of an interference condition between the module 12 and the base structure 14, the second pair of protrusions 32 includes a protrusion spacing 86 that is greater than an initial wing portion distance 88.

The protrusion spacing 86 is defined as a distance between innermost points of the second pair of protrusions 32. The initial wing portion distance 88 is defined by a distance between the outer edges of the downwardly extending wing portions 82 at the uppermost location of the wing portions 82. The wing portions 82 then extend downwardly and outwardly to form the lead-in surface 99 noted above. These dimensions ensure that contact is made between the second pair of protrusions 32 and the second bracket 60 along the lead-in surface 99.

Figure 5:
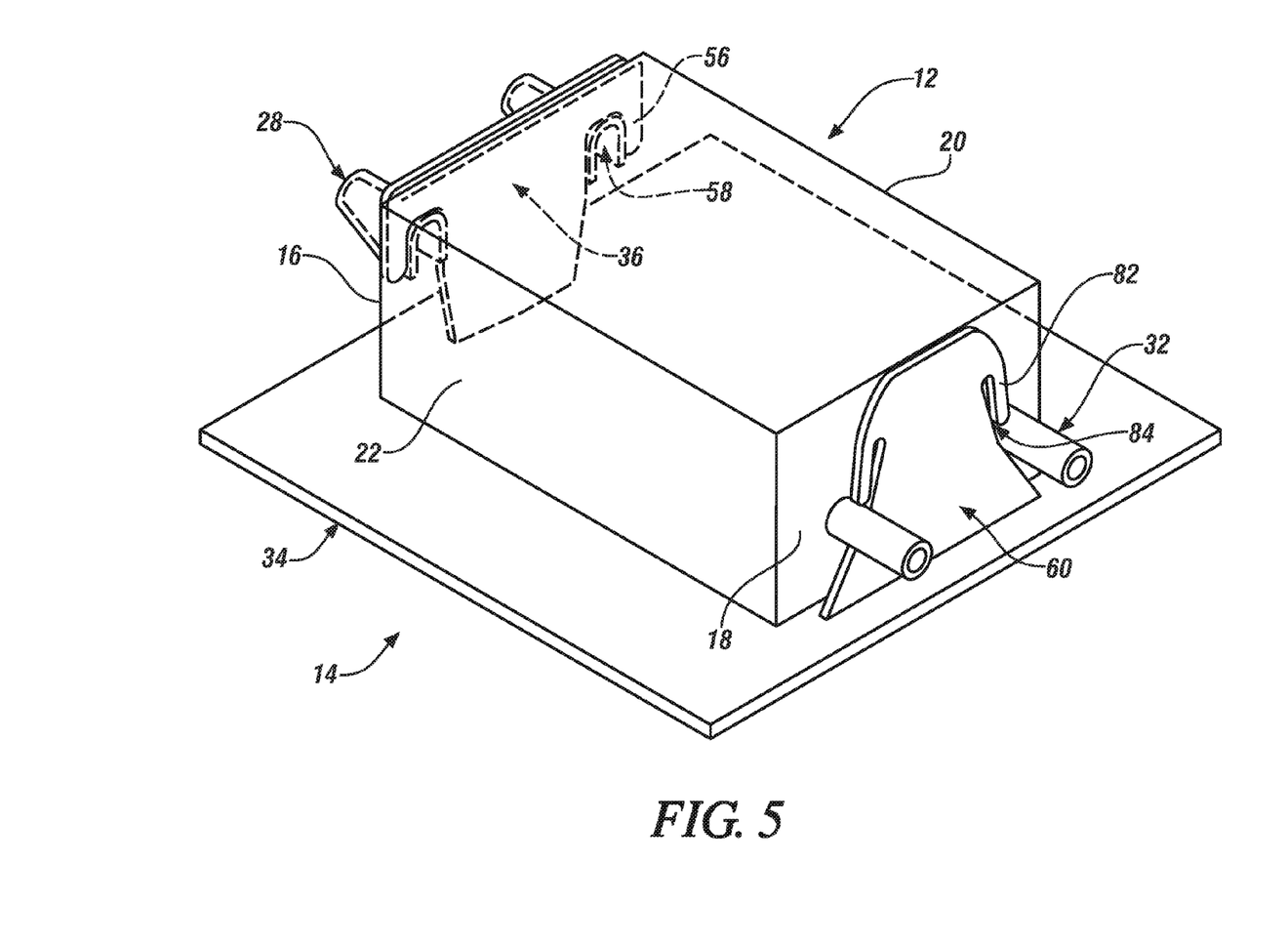
FIG. 5 is a perspective view of the elastically deformable module installation assembly of FIG. 1 in a fully assembled condition.
Figure 6:
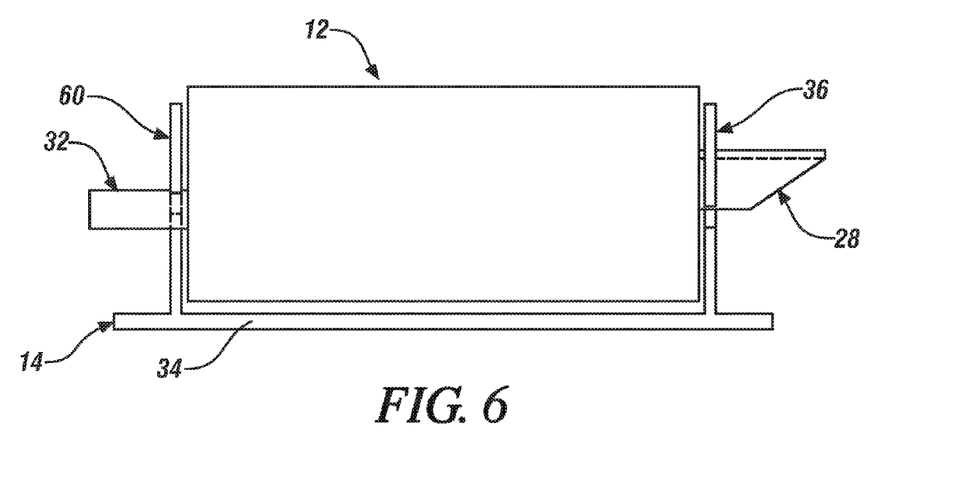
FIG. 6 is a side view of the module and the base structure of FIG. 5 in the fully assembled condition of FIG. 5.

The rotational arrows B (FIG. 2) represent the direction of rotation that is imparted on the module 12 to facilitate assembly of the module 12 and the base structure 14. Rotation in direction B occurs during a transition from the partially assembled condition (FIG. 2) to the fully assembled condition (FIG. 5). During such a transition, a closed end of the first pair of protrusions 28 is configured to lead the first pair of protrusions 28 into the pair of recesses 58 of the first bracket 36. In one embodiment, sufficient clearance between the ends of the module 12 and the brackets 36, 60 is provided to allow the module 12 to be inserted into the base structure 14 and rotated therein, such that substantially rigid brackets may be employed. In another embodiment, the brackets 36, 60 are formed of a flexible or elastically deformable material to allow flexure and/or deformation of the brackets 36, 60 during insertion of the module 12. Specifically, the module 12 can contact the brackets 36, 60 and bias them outwardly to accommodate the dimensions of the module 12 in the angled insertion position.

At some point during rotation of the module 12, the first pair of protrusions 28 engage the edges of the main portion 40 of the first bracket 36. The precise position where engagement between the protrusions and the edges of the main portion 40 occurs will vary depending on positional variance imposed by manufacturing factors. Due to the elastically deformable properties of the elastic material comprising the first pair of protrusions 28, the criticality of the initial location of engagement is reduced. The outwardly angled configuration of the edges of the main portion 40 of the first bracket 36 ultimately imposes a biasing force on the first pair of protrusions 28, thereby leading to an interference condition between the protrusions and the edges of the main portion 40 of the first bracket 36. The interference condition causes elastic deformation of the protrusions. The malleability of the materials reduces issues associated with positional variance. More particularly, in contrast to a rigid insert that typically results in gaps between the insert and receiving structure at portions around the perimeter of the insert, the first pair of protrusions advantageously deforms to maintain alignment of the module 12 and the base structure 14, while also reducing or eliminating gaps associated with manufacturing challenges. During rotation of the module 12, the first pair of protrusions 28 slides further up the edges of the main portion 40, ultimately leading to a fully engaged and assembled condition, as will be described in detail below.

At the second module end 18, the second pair of protrusions 32 are moved downwardly toward the base portion 34 of the base structure 14 and over the outer edges 99 of the downwardly extending wing portions 82. As with the first pair of protrusions 28, the second pair of protrusions 32 are each elastically deformed as the protrusions 32 are pushed down wings 82 along the lead-in surface 99 during the installation due to the dimensioning described above.

It is to be appreciated that either or both of the brackets 36, 60 may be formed of an elastically deformable material to facilitate deformation of the brackets 36, 60 during installation of the module 12. In such an embodiment, the downwardly extending wing portions 82 may flex inwardly upon passage of the second pair of protrusions 32 over them, for example.

Figure 7:
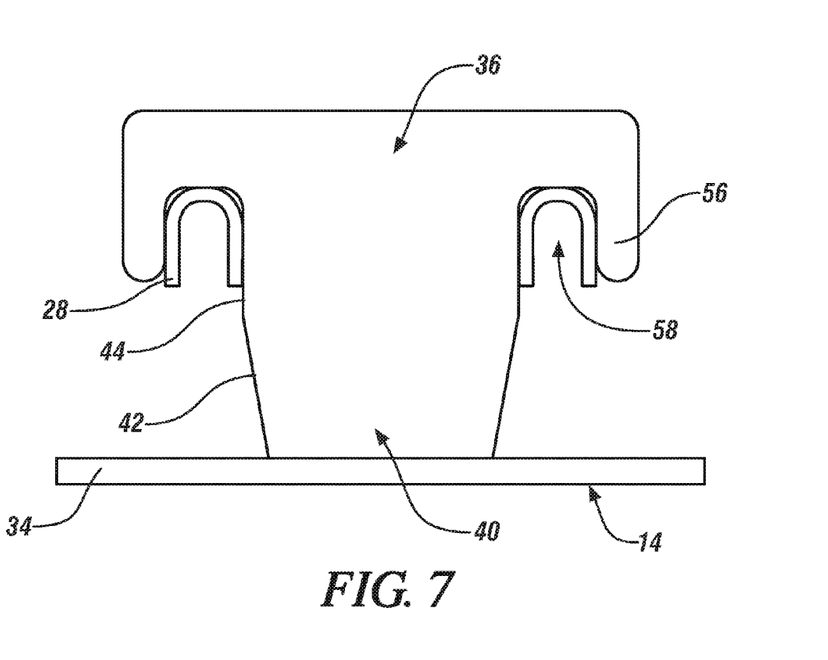
FIG. 7 is a partially schematic first end view of the module and the base structure of FIG. 5 in the fully assembled condition of FIG. 5.
Figure 8:
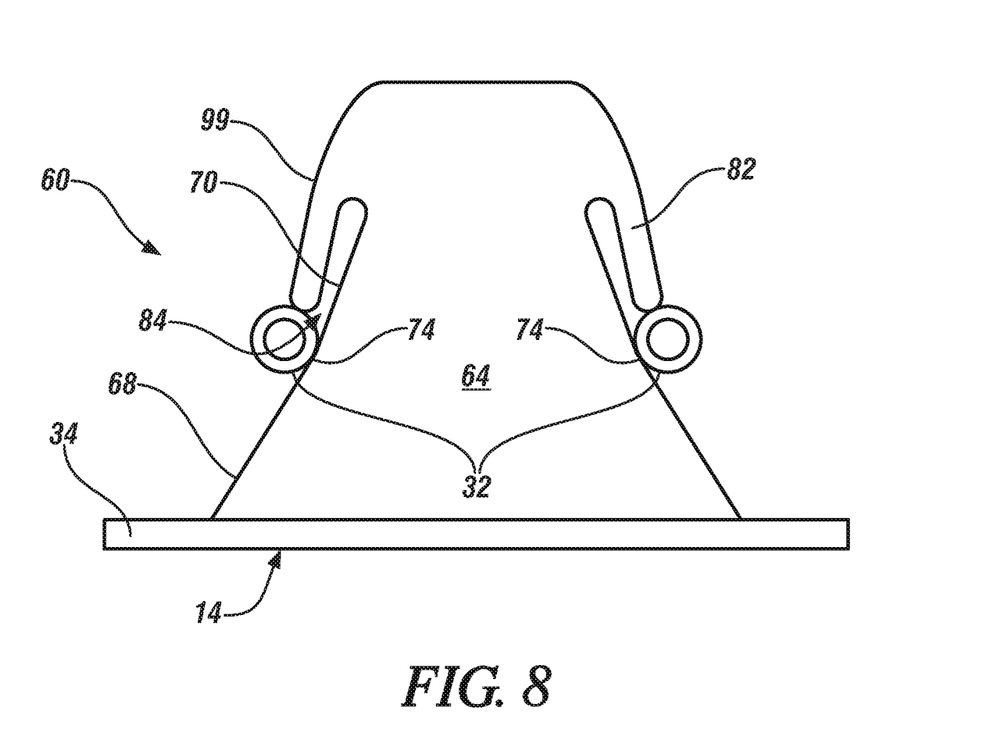
FIG. 8 is a partially schematic second end view of the module and the base structure of FIG. 5 in the fully assembled condition of FIG. 5.

As noted above, FIGS. 5-8 illustrate the module 12 in a configuration corresponding to full assembly of the module 12 with the base structure 14. Further rotation of the module 12 relative to the base structure 14 ultimately leads to a fully engaged condition of the module 12. In the fully engaged condition, a tight, fitted engagement between the module 12 and the base structure 14 is achieved by contact interface between the first pair of protrusions 28 and the pair of recesses 58 of the first bracket 36, as well as contact interference between the second pair of protrusions 32 and an outer edge or portion of the main portion 64 of the second bracket 60, as well as at the end of wings 82. Such a condition is ensured by sizing the first pair of protrusions 28 to be larger than the pair of recesses 58 of the first bracket 36 in at least one dimension (e.g., width, diameter, circumference, etc.) (FIG. 7). Similarly, the second pair of protrusions 32 are sized to be spaced at a distance from each other to ensure contact with the lead-in surface 99 of the downwardly extending wing portions 82 of the second bracket 60 as they translate downwardly along the outer edges upon rotation of the module 12 into the final position shown in FIG. 8. In the final illustrated position, it is shown that the second pair of protrusions 32 are seated at the depression formed by the distinct angles of the first portion 68 and the second portion 70 of the main portion 64 of the second bracket 60. Specifically, the second pair of protrusions 32 are disposed at the second end 74 of the main portion 64 and in an interference condition with the edge of the main portion 64 and the wings 82. The interference condition is further ensured by sizing the above-defined protrusion spacing 86 to be smaller than a distance 89 between the second ends 74 of the main portion, as shown in FIG. 4.

The elastic deformation of the plurality of protrusions 28, 32, in combination, elastically averages any positional errors of the module 12 and the base structure 14. In other words, gaps that would otherwise be present due to positional errors associated with portions or segments of the module 12 and the base structure 14, particularly locating and retaining features, are eliminated by offsetting the gaps with an over-constrained condition of other elastically deformable protrusions. Specifically, the positional variance of each protrusion and/or recess is offset by the remaining protrusions to average in aggregate the positional variance of each protrusion. The embodiments described herein reduce wear, looseness, noise and the likelihood of potential module separation that may arise due to manufacturing challenges. By reducing vibration associated with the components, the likelihood of module separation is reduced. This is achieved by increasing the stiffness of the interface between the components due to stored energy of the elastic averaging components.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. An elastically deformable module installation assembly comprising:
    a base structure having a base portion, a first bracket and a second bracket, the base portion disposed substantially in a base plane, the first bracket extending substantially perpendicularly from the base portion, the second bracket extending substantially perpendicularly from the base portion, wherein the first bracket is a substantially T-shaped member having a main portion, a pair of downwardly extending wing portions and a pair of recesses defined by the pair of downwardly extending wing portions and a segment of the main portion; and
    a module configured to be mated with the base structure, the module including a first module end and a second module end, wherein the first module end includes a first pair of protrusions formed of an elastically deformable material and configured to be rotated into an interference condition with the first bracket upon insertion into the pair of recesses of the first bracket, wherein each of the first pair of protrusions comprises a protrusion width and the pair of recesses comprises a recess width, the protrusion width being greater than the recess width.

2. The assembly of claim 1, further comprising a second pair of protrusions extending from the second module end, the second pair of protrusions configured to be rotated downwardly into an interference condition with a pair of outer edges of a main portion of the second bracket and end portions of a pair of downwardly extending wing portions of the second bracket.

3. The assembly of claim 2, wherein the second pair of protrusions are formed of an elastically deformable material.

4. The assembly of claim 2, wherein the second bracket is formed of an elastically deformable material.

5. The assembly of claim 2, wherein the second pair of protrusions and the second bracket are formed of an elastically deformable material.

6. The assembly of claim 2, wherein the second pair of protrusions comprise hollow, tubular members.

7. The assembly of claim 2, wherein the second bracket is a substantially T-shaped member having a main portion, a pair of downwardly extending wing portions and a pair of recesses defined by the pair of downwardly extending wing portions and a segment of the main portion.

8. The assembly of claim 7, further comprising:
    an initial wing portion distance defined by a distance between the outer edges of the downwardly extending wing portions; and
    a protrusion spacing width defined by a distance between the second pair of protrusions, wherein the initial wing portion distance is less than the protrusion spacing width.

9. The assembly of claim 8, wherein the downwardly extending wing portions are configured to flex inwardly toward the main portion of the second bracket upon engagement with the second pair of protrusions upon downward rotation of the second module end.

10. The assembly of claim 1, wherein the first bracket is formed of an elastically deformable material.

11. The assembly of claim 1, wherein the main portion of the first bracket comprises a first portion and a second portion, wherein edges of the first portion and the second portion are oriented at distinct angles relative to the base portion of the base structure.

12. The assembly of claim 11, wherein the main portion of the first bracket comprises a first bracket width at a first bracket end and a second width at a second bracket end, the second width being greater than the first width.

13. The assembly of claim 1, wherein the first bracket and the second bracket are spaced from each other and extend perpendicularly from the base portion to receive the module therebetween.

14. The assembly of claim 1, wherein the base structure and the module are vehicle components.

15. The assembly of claim 14, wherein the module is an electrical module.

16. An elastically deformable module installation assembly comprising:
    a base structure having a base portion, a first bracket and a second bracket, the base portion disposed substantially in a base plane, the first bracket extending substantially perpendicularly from the base portion, the second bracket extending substantially perpendicularly from the base portion, wherein the first bracket is a substantially T-shaped member having a main portion, a pair of downwardly extending wing portions and a pair of recesses defined by the pair of downwardly extending wing portions and a segment of the main portion; and
    a module configured to be mated with the base structure, the module including a first module end and a second module end, wherein the first module end includes a first pair of protrusions formed of an elastically deformable material and configured to be rotated into an interference condition with the first bracket upon insertion into the pair of recesses of the first bracket, wherein the first pair of protrusions are substantially U-shaped protrusions, wherein a closed end of the first pair of protrusions is configured to lead the first pair of protrusions in the direction of rotation of the first pair of protrusions into the pair of recesses of the first bracket.

17. An elastically deformable module installation assembly comprising:
a base structure comprising:
a base portion disposed substantially in a base plane; and
a first bracket and a second bracket, the first bracket extending substantially perpendicularly from the base portion, the second bracket extending substantially perpendicularly from the base portion, wherein the first bracket and the second bracket are each substantially T-shaped members having respective main portions, respective pairs of downwardly extending wing portions and respective pairs of recesses defined by the pairs of downwardly extending wing portions and a segment of the main portions; and
a module configured to be mated with the base structure, the module comprising:
a first module end and a second module end, wherein the first module end includes a first pair of protrusions formed of an elastically deformable material and configured to be rotated into an interference condition with the first bracket upon insertion into the pair of recesses of the first bracket, wherein each of the first pair of protrusions comprises a protrusion width and the pair of recesses of the first bracket comprises a recess width, the protrusion width being greater than the recess width; and
a second pair of protrusions extending from the second module end, the second pair of protrusions configured to be rotated downwardly into an interference condition with a pair of outer edges of a main portion of the second bracket and a pair of downwardly extending wing portions of the second bracket.

18. The assembly of claim 17, further comprising:
an initial wing portion distance defined by a distance between the outer edges of the downwardly extending wing portions; and
a protrusion spacing width defined by a distance between the second pair of protrusions, wherein the initial wing portion distance is less than the protrusion spacing width, wherein the downwardly extending wing portions are configured to flex inwardly toward the main portion of the second bracket upon engagement with the second pair of protrusions upon downward rotation of the second module end.

19. The assembly of claim 17, wherein the base structure and the module are vehicle components, the module being an electrical module.

* * * * *